(12) United States Patent
Dow et al.

(10) Patent No.: US 10,737,434 B2
(45) Date of Patent: Aug. 11, 2020

(54) METHODS AND SYSTEMS FOR FAST IMPRINTING OF NANOMETER SCALE FEATURES IN A WORKPIECE

(71) Applicant: North Carolina State University, Raleigh, NC (US)

(72) Inventors: Thomas A. Dow, Cary, NC (US); Erik Zdanowicz, Pullman, WA (US); Alexander Sohn, Fuquay-Varina, NC (US); Ron Scattergood, Cary, NC (US); William John Nowak, Jr., Cary, NC (US)

(73) Assignee: North Carolina State University, Raleigh, NC (US)

( * ) Notice: Subject to any disclaimer, the term of this patent is extended or adjusted under 35 U.S.C. 154(b) by 288 days.

(21) Appl. No.: 15/863,849

(22) Filed: Jan. 5, 2018

(65) Prior Publication Data

US 2018/0141265 A1 May 24, 2018

Related U.S. Application Data

(62) Division of application No. 14/431,348, filed as application No. PCT/US2013/062218 on Sep. 27, 2013, now Pat. No. 9,956,720.

(Continued)

(51) Int. Cl.
*B21D 31/06* (2006.01)
*B29C 59/02* (2006.01)
(Continued)

(52) U.S. Cl.
CPC ............ *B29C 59/022* (2013.01); *B21D 31/06* (2013.01); *B29C 33/3878* (2013.01);
(Continued)

(58) Field of Classification Search
CPC ...... B21D 31/005; B21D 31/06; B21D 37/10; B29C 59/022; B29C 2059/023;
(Continued)

(56) References Cited

U.S. PATENT DOCUMENTS 5,205,147 A * 4/1993 Wada .................. B21D 28/002
310/328
5,615,569 A * 4/1997 Schlatter ................. B21J 9/025
72/67

(Continued)

FOREIGN PATENT DOCUMENTS

| JP | 2006-237395 | 9/2006 |
| JP | 2007-081048 | 3/2007 |
| WO | WO 2007/132320 A2 | 11/2007 |

OTHER PUBLICATIONS

Notice of Allowability for U.S. Appl. No. 14/431,348 (dated Apr. 5, 2018).

(Continued)

*Primary Examiner* — Edward T Tolan
(74) *Attorney, Agent, or Firm* — Jenkins, Wilson, Taylor & Hunt, P.A.

(57) ABSTRACT

The subject matter described herein relates to methods and systems for fast imprinting of nanometer scale features in a workpiece. According to one aspect, a system for producing nanometer scale features in a workpiece is disclosed. The system includes a die having a surface with at least one nanometer scale feature located thereon. A first actuator moves the die with respect to the workpiece such that the at least one nanometer scale feature impacts the workpiece and imprints a corresponding at least one nanometer scale feature in the workpiece.

13 Claims, 19 Drawing Sheets

Related U.S. Application Data

(60) Provisional application No. 61/706,738, filed on Sep. 27, 2012.

(51) Int. Cl.

| | | |
|---|---|---|
| *B29C 33/42* | (2006.01) | |
| *B81C 99/00* | (2010.01) | |
| *B29C 33/38* | (2006.01) | |
| *H01L 31/0232* | (2014.01) | |
| *B29L 31/00* | (2006.01) | |
| *B82Y 40/00* | (2011.01) | |
| *B21D 31/00* | (2006.01) | |
| *B29L 11/00* | (2006.01) | |

(52) U.S. Cl.
CPC ........ B29C 33/424 (2013.01); B81C 99/0025 (2013.01); H01L 31/02325 (2013.01); *B21D 31/005* (2013.01); *B29C 2059/023* (2013.01); *B29K 2995/0018* (2013.01); *B29K 2995/0093* (2013.01); *B29L 2011/00* (2013.01); *B29L 2031/7562* (2013.01); *B81C 2201/0153* (2013.01); *B82Y 40/00* (2013.01)

(58) Field of Classification Search
CPC ............ B81C 1/0046; B81C 2201/015; B81C 2201/0152; B81C 2201/0153; B21J 9/025
See application file for complete search history.

(56) References Cited

U.S. PATENT DOCUMENTS

| | | | | |
|---|---|---|---|---|
| 6,145,362 | A * | 11/2000 | Piispanen | B21J 9/025 72/82 |
| 6,343,495 | B1 * | 2/2002 | Cheppe | B23P 9/04 72/53 |
| 6,517,319 | B2 * | 2/2003 | Webster | C21D 7/04 416/241 R |
| 6,932,934 | B2 * | 8/2005 | Choi | B29C 35/0888 216/11 |
| 8,163,656 | B2 | 4/2012 | Chou et al. | |
| 8,616,874 | B2 * | 12/2013 | Kasumi | B82Y 10/00 425/400 |
| 9,352,543 | B2 * | 5/2016 | Weiss | B41D 7/00 |
| 9,956,720 | B2 | 5/2018 | Dow et al. | |
| 2004/0192041 | A1 * | 9/2004 | Jeong | B82Y 10/00 438/689 |
| 2006/0005657 | A1 * | 1/2006 | Choi | B29C 43/021 74/490.07 |
| 2006/0272535 | A1 * | 12/2006 | Seki | B82Y 10/00 101/492 |
| 2008/0145617 | A1 * | 6/2008 | Pethica | B29C 43/003 428/156 |
| 2009/0046362 | A1 | 2/2009 | Guo et al. | |
| 2009/0273119 | A1 * | 11/2009 | Imai | G11B 5/743 264/293 |
| 2010/0084376 | A1 * | 4/2010 | Khusnatdinov | B82Y 10/00 216/39 |
| 2010/0193997 | A1 | 8/2010 | Frederickson et al. | |
| 2010/0258978 | A1 * | 10/2010 | Yamada | B29C 59/04 264/293 |
| 2012/0040090 | A1 | 2/2012 | Jeng et al. | |
| 2012/0061882 | A1 * | 3/2012 | Furutono | B29C 59/022 264/496 |
| 2015/0239172 | A1 | 8/2015 | Dow et al. | |

OTHER PUBLICATIONS

Notice of Allowance and Fee(s) Due and Examiner-Initiated Interview Summary for U.S. Appl. No. 14/431,348 (dated Feb. 21, 2018).
Supplemental Declaration of Gregory A. Hunt Regarding Inventorship Investigation (Executed Jan. 4, 2018).
Notice of Allowance and Fee(s) Due and Examiner-Initiated Interview Summary for U.S. Appl. No. 14/431,348 (dated Oct. 4, 2017).
Restriction and/or Election Requirement for U.S. Appl. No. 14/431,348 (dated May 16, 2017)
Notification of Transmittal of the International Search Report and the Written Opinion of the International Searching Authority, or the Declaration for International Application No. PCT/US2013/062218 (dated Dec. 16, 2013).
Email regarding Nanocoining Patent Application, pp. 1 (Transmitted Sep. 23, 2013).
"Trail of idea generation for the Nanocoin concept," pp. 1 (Dated May 25, 2013).
"Creating Nanometer Features in a Diamond Turning Machine," Proposal to 3M Company, pp. 1-18 (Dated Jun. 1, 2006).
Jeong et al., "Hybrid silicon nanocone-polymer solar cells," Nano Lett., vol. 12, pp. 2971-2976 (2012).
Park et al., "Nanotextured silica surfaces with robust superhydrophobicity and omnidirectional broadband supertransmissivity," ACS Nano, Article, pp. A-K (2012).
Tommila et al., "Moth-eye antireflection coating fabricated by nanoprint lithography on 1 eV dilute nitride solar cell," Prog. Photovoltaics Res. Appl., 21, pp. 158-1162 (2012).
Han et al., "Enhanced performance of solar cells with anti-reflection layer fabricated by nano-imprint lithography," Solar Energy Mater. Solar Cells, vol. 95, pp. 288-291 (2011).
Zdanowicz et al., "Nanocoining of Optical Features," Proceedings of the 26th Annual Meeting of The American Society for Precision Engineering, ASPE 2011, vol. 52, pp. 106-109 (Nov. 13-18, 2011).
Boden et al., "Optimization of moth-eye antireflection schemes for silicon solar cells," Prog. Photovoltaics Res. Appl., vol. 18, pp. 195-203 (2010).
Wang et al., "AFM Tip Hammering Nanolithography," small, vol. 5, No. 4, pp. 477-483 (2009).
Kurnia et al., "Nano/micro structure fabrication of metal surfaces using the combination of nano plastic forming, coating and roller imprinting processes," Journal of Micromechanics and Microengineering, vol. 19, 125028, pp. 1-11 (2009).
Chen et al., "Broadband moth-eye antireflecion coatings fabricated by low-cost nanoimprinting," Aplied Physics Letters, vol. 94, pp. 1-3 (2009).
Boden et al., "Tunable reflection minima of nanostructured antireflective surfaces," Appl. Phys. Lett., vol. 93, pp. 113108-1-133108-3 (2008).
Forberich et al., "Performance Improvement of Organic Solar Cells with Moth Eye Anti-reflection Coating," Thin Solid Films, vol. 56, pp. 7167-7170 (2008).
Huang et al., "Improved broadband and quasi-omnidirectional antireflection properties with biomimetic silicon nanostructures," Nature Nanotechnology, vol. 2, pp. 770-774 (2007).
Feng et al., "Design and creation of superwetting/antiwetting surfaces," Adv. Mater., vol. 18, pp. 3063-3078(2006).
Stavenga et al., "Light on the moth-eye corneal nipple array of butterflies," Proceedings of the Royal Scoiety B: Biological Sciences, vol. 273, pp. 661-667 (2006).
Zhang et al., "Superhydrophobic behavior of a perfluoropolyether lotus-leaf-like topography," Langmuir, vol. 22, No. 20, pp. 8576-8580 (2006).
Ahn et al., "Fabrication of a 50 nm half-pitch wire grid polarizer using nanoimprint lithography," Nanotechnology, vol. 16, pp. 1874-1877 (2005).
Watson et al., "Natural nano-structues on insects—Possible functions of ordered arrays characterized by atomic force microscopy," Appl. Surf. Sci., vol. 235, pp. 139-144 (2004).
Toyota et al., "Fabrication of microcone array for antireflection structured surface using metal dotted pattern," Japanese Journal of Applied Physics, vol. 40, pp. L747-L749 (2001).
Kanamori et al., "Broadband antireflection gratings fabricated upon silicon substrates," Opt. Lett., vol. 24, No. 20, pp. 1422-1424 (Oct. 15, 1999).
Pharr, "Measurement of mechanical properties by ultra-low load indentation," Material Science and Engineering: A, vol. 253, pp. 151-159 (1998).

(56) References Cited

OTHER PUBLICATIONS

Lalanne et al., "Antireflection behavior of silicon subwavelength periodic structures for visible light," Nanotechnology, vol. 8, pp. 53-56 (1997).
Grann et al., "Optimal design for antireflective tapered two-dimensional subwavelength grating structures," J. Opt. Soc. Am., vol. 12, No. 2, pp. 333-339 (1995).
Wilson et al., "The optical properties of 'moth eye' antireflection surfaces," Optica Acta: International Journal of Optics, vol. 29, pp. 993-1009 (1982).
Clapham et al., "Reduction of lens reflexion by the 'moth eye' principle," Nature, vol. 244, pp. 281-282 (1973).
Declaration of Gregory A. Hunt Regarding Inventorship Investigation (Sep. 27, 2017).

* cited by examiner

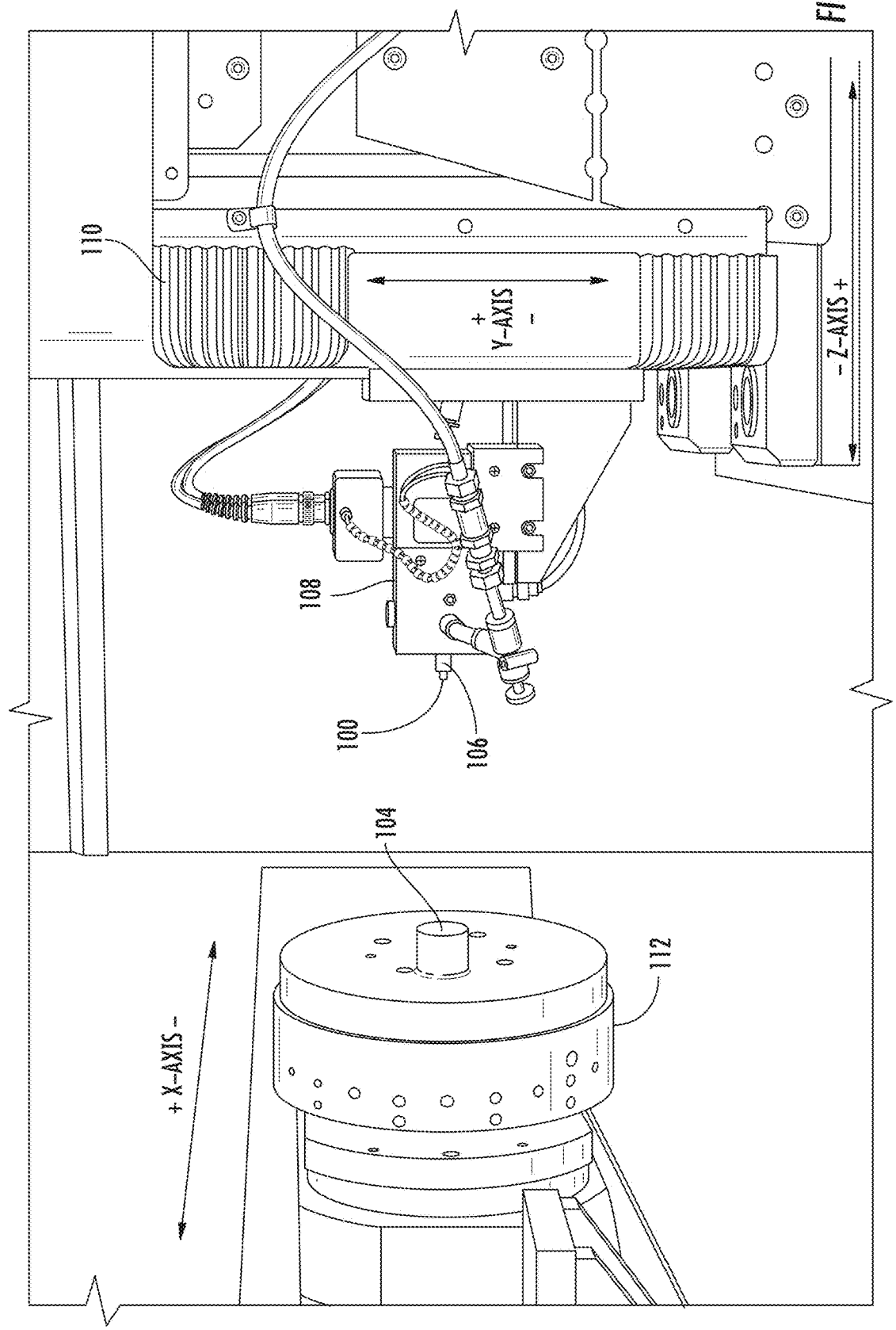

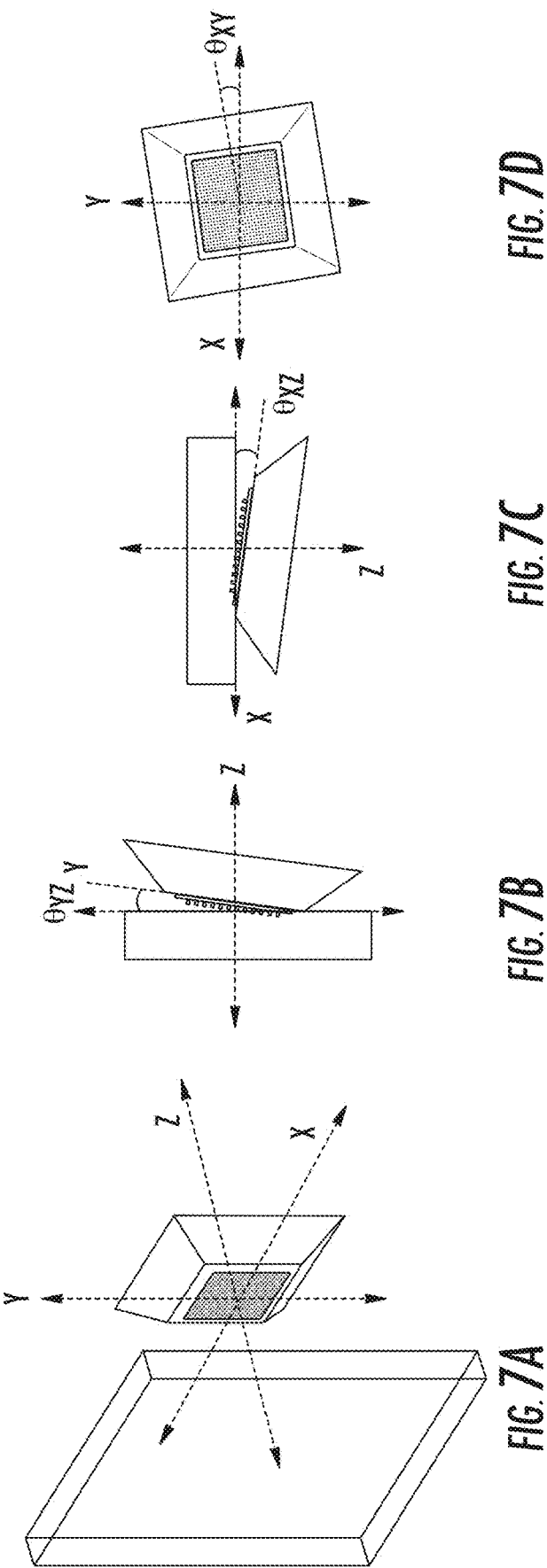

1ST TEST

10μm

3RD TEST

10μm

6TH TEST

10μm

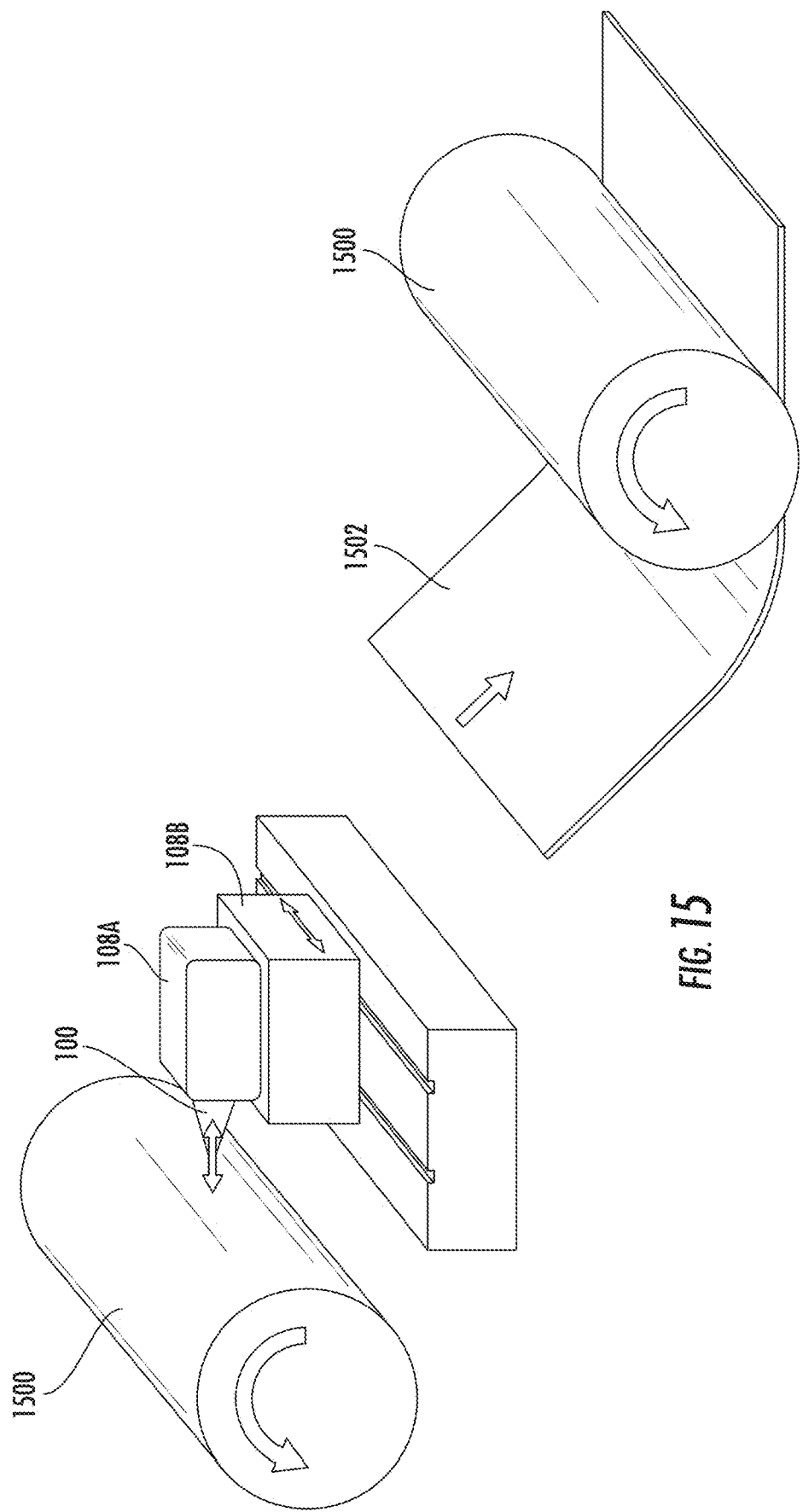

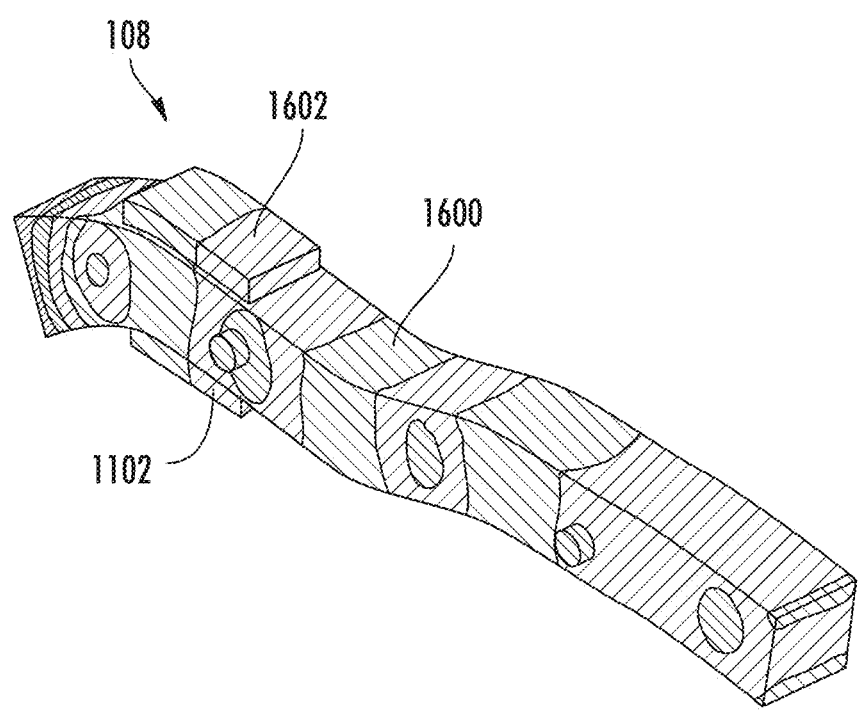
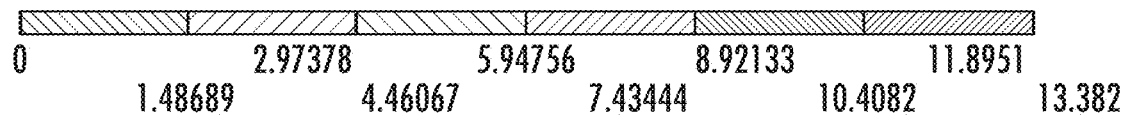
FIG. 17

METHODS AND SYSTEMS FOR FAST IMPRINTING OF NANOMETER SCALE FEATURES IN A WORKPIECE

PRIORITY CLAIM

This application is a divisional of U.S. patent application Ser. No. 14/431,348, filed Mar. 26, 2015, which is a national stage application under 35 U.S.C. § 371 of PCT Patent Application No. PCT/US2013/062218 filed Sep. 27, 2013, which claims the benefit of U.S. Provisional Patent Application Ser. No. 61/706,738, filed Sep. 27, 2012; the disclosures of which are incorporated herein by reference in their entireties.

GOVERNMENT INTEREST

This invention was made with government support under Grant No. NM-1000055 awarded by the National Science Foundation. The government has certain rights in the invention.

TECHNICAL FIELD

The subject matter described herein relates to imprinting structures in a substrate. More particularly, the subject matter described herein relates methods and systems for fast imprinting of nanometer scale features in a workpiece.

BACKGROUND

Bio-inspired nanostructured surfaces are covered with nanometer scale features which, depending on their size and spacing, can produce valuable properties [1]. Nanofeatures found on the surface of moth eyes create an anti-reflective (AR) property which can serve as a defense mechanism for this nocturnal insect by blending the index of refraction from the air to the eye surface [2, 3]. Similar tapered features can be placed on a surface creating a gradual change in index of refraction from the air to the surface preventing a sharp change in index of refraction at the air-surface interface reducing Fresnel reflection [4-7]. For nanofeatures to produce the AR property the period of the features must be less than the wavelength in the visible spectrum (380-750 nm) [8, 9]. These types of surfaces can be useful in photovoltaic applications because of their ability to perform over multiple wavelengths of light and large viewing angles [10-14]. Structures found on the surface of the lotus leaf produce a superhydrophobic effect where water droplets sit on the surface with a very high contact angle (>150°) [15, 16]. Water droplets roll off the leaf surface easily due to this high contact angle and pick up debris along the way to clean the surface. This property would also be attractive for photovoltaic cell coatings where build-up from operating in an outdoor environment is inevitable. While both properties are desirable, the main focus of this research has been on generating AR (optical) nanofeatures.

The use of nanostructured surfaces like the ones found on moth eyes has become increasingly popular in consumer and commercial applications. The advantages of structured surfaces have been recognized and the demand for inexpensive coatings is high. The limitation of these nanostructured surfaces is the length of time required to produce a usable quantity. Current techniques for generating nanostructured surfaces have been successful but are not feasible because of long manufacturing times. Lithography methods are popular and can produce a limited area of high quality features, but suffer from a large number of manufacturing steps (spin coating, baking, etching, . . . ) as well as long duration (the baking can take 10 h) [17, 18].

Accordingly, there exists a need for methods and systems for fast imprinting of nanometer scale features in a workpiece.

SUMMARY

The subject matter described herein relates to methods and systems for fast imprinting of nanometer scale features in a workpiece. According to one aspect, a system for producing nanometer scale features in a workpiece is disclosed. The system includes a die having a surface with at least one nanometer scale feature located thereon. A first actuator moves the die with respect to the workpiece such that the at least one nanometer scale feature impacts the workpiece and imprints a corresponding at least one nanometer scale feature in the workpiece.

The subject matter described herein may be implemented in hardware, software, firmware, or any combination thereof. As such, the terms "function" "node" or "module" as used herein refer to hardware, which may also include software and/or firmware components, for implementing the feature being described. In one exemplary implementation, the subject matter described herein may be implemented using a computer readable medium having stored thereon computer executable instructions that when executed by the processor of a computer control the computer to perform steps. Exemplary computer readable media suitable for implementing the subject matter described herein include non-transitory computer-readable media, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

BRIEF DESCRIPTION OF THE DRAWINGS

The subject matter described herein will now be explained with reference to the accompanying drawings of which:

FIG. 1B is a schematic diagram of an exemplary system for imprinting nanometer scale features in a workpiece according to an embodiment of the subject matter described herein;

FIGS. 7A-7D illustrate different imprinting angles between a die and a workpiece according to an embodiment of the subject matter described herein;

FIG. 15 is a schematic diagram illustrating nano-imprinting features on the sidewall of the cylinder and the use of the cylinder to imprint features in a substrate according to an embodiment of the subject matter described herein;

FIG. 17 is a diagram of a simulation of displacement of the actuator design illustrated in FIG. 16;

DETAILED DESCRIPTION

Figure 1A:
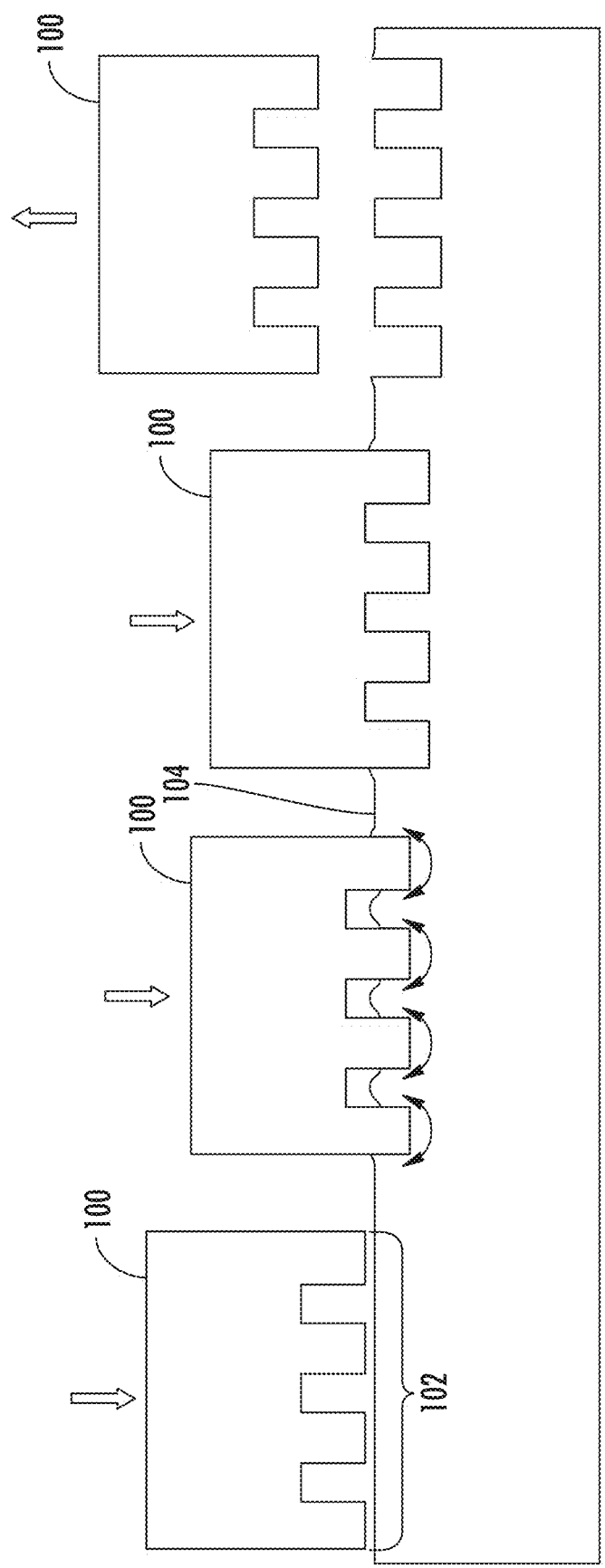
FIG. 1A is a schematic diagram illustrating the imprinting of nanometer scale features in a workpiece according to an embodiment of the subject matter described herein.

A new process called nanocoining was developed to address the limitation in production time. Nanocoining uses a micro-scale diamond die with a nanostructured area attached to a high speed actuator to transfer the features to a mold surface. The process of nanocoining, as seen in FIG. 1A, involves pressing a diamond die 100 with a mold pattern 102 into a work-piece 104 surface until the stress is high enough to induce plastic flow. In one embodiment, the features on the surface of die 100 comprise nanometer scale features.

Die 100 is forced until the work-piece material fills the voids of the mold. Die 100 is then withdrawn and the plastically deformed shape remains on the mold surface. The surface of workpiece 104 would be completely covered with features. In one embodiment, workpiece 104 comprises a drum, which is subsequently used to mass produce sheets of nanostructured surfaces by rolling the drum across the sheets such that the structures imprinted on the surface of the drum produce corresponding structures in the sheets of material. These sheets of nanostructures could then be attached to surfaces depending on the property produced by the features. Areas of precisely indexed nano-indents have been created with nanofeatures exhibiting high fidelity using the nanocoining process.

2. Process Details

There are three main elements to one embodiment of a nanocoining process: (1) the diamond die, (2) the 2D actuator and (3) the precision lathe. In one exemplary implantation illustrated in FIG. 1B, die 100 is attached to a toolholder 106 mounted on the end of an elliptical actuator 108 which was mounted on the vertical axis of a four-axis diamond turning machine (DTM) 110. The parameters of tool holder 106, actuator 108, and DTM 110 had to be carefully controlled to produce high quality indents. In FIG. 1B, actuator 108 is a non-resonant actuator. In an alternate implementation, resonant actuators can be used as will be described in more detail below.

In FIG. 1B, mold 104 is mounted on an air bearing spindle 112 that rotates with respect to die 100 during the nano-imprinting process. An exemplary operation of the system illustrated in FIG. 1B will be described in detail below.

2.1. Diamond Dies

Figure 2:
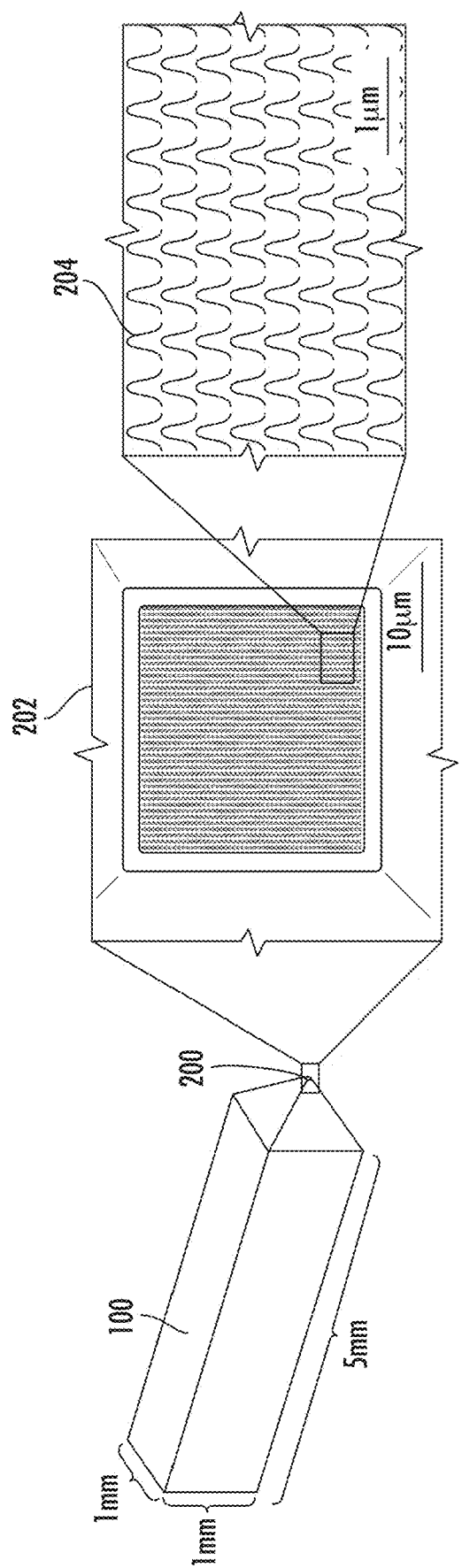
FIG. 2 is a diagram of an exemplary die with nanometer scale features used for imprinting corresponding negative features in a workpiece according to an embodiment of the subject matter described herein.

In one exemplary implementation, the diamond dies used in nanocoining had 20 µm×20 µm areas of nanofeatures. Each cone-like nanofeature was 330 nm wide at the base and 360 nm tall with a 160 nm radius at the tip. The spacing between features was 530 nm. An exemplary die 100 and features imprinted by the die can be seen in FIG. 2. In FIG. 2, die 100 includes a tip 200 on which is patterned a grid of nanometer scale features. Views 202 and 204 illustrate the pattern of nanometer scale features. As illustrated by view 204, each of the nanometer scale features comprises a grid of bumps, each having a lateral dimension of less than one micrometer. The dimensions illustrated in FIG. 2 are illustrative and are not intended to be limiting to the subject matter described herein. Smaller or larger features may be used without departing from the scope of the subject matter described herein. In addition, patterns other than those illustrated in FIG. 2 may be located on the tip of die 100 without departing from the scope of the subject matter described herein.

To create anti-reflective (AR) surfaces it is critical that the spacing of the features on the die is less than the wavelength of visible light (380-700 nm). Because the property of the overall surface is dictated by the size and spacing of the features, it would be possible to have a collection of dies which could be mounted on the actuator depending on the desired effect.

For superhydrophobic or other applications, it may be desirable to create features having at least one dimension in the range of 10 nm to 10 microns. For other applications, the feature scale may range between 400 nm and 600 nm.

The features on the die shown in FIG. 2 were machined with a focused ion beam (FIB) to the same shape as the desired features of the final surface. Therefore, this die would transfer its features (positive) to a mold surface by creating depressions on the surface (negative). The mold would then be used to create the final replicated part which would have features resembling the die's features (positive). Alternatively, the diamond die could be fabricated with depressions which would exhibit the negative of the desired final features. A die like this could be used to directly nanocoin a part with positive protruding features on its surface. Nanocoining features directly onto a surface could be attractive in scenarios where the nanofeatures need to be robust and would be of the same material as the surface instead of plastic.

2.2. The Tool-Path and Elliptical Actuator

Because the nanostructured area on the die is small relative to the desired total mold area (⅕ the diameter of human hair), the indentation rate must be high. This also implies that the mold must constantly be moving since stopping and starting would slow the process. The mold is defined as the part that is indented with the die and used to create replicates. A moving mold poses a problem to a traditional tool-path where the die is thrust into and out of the mold orthogonal to the direction of motion. If the die is pressed into a moving mold in this manner, the features will smear by a distance dictated by the mold speed and contact time. Smearing cannot only distort the features transferred to the mold, but also cause material to become lodged in-between the nanofeatures on the die which further hampers the indenting process. In some severe cases, velocity mismatch between the die and mold (causing smear) has resulted in individual nanofeatures breaking away from the die indentation face. Without the ability to match speed the indentation process will not work at high rates making the process ineffective.

To avoid the issue of smear and match the die and mold velocity it was necessary to introduce a second component of motion to the tool-path in the direction of the mold motion. There are a number of 2D tool-path shapes that can have simultaneous vertical and horizontal motion. A geometry that has easily adjusted parameters and is already used in some precision machining processes is the ellipse. An illustration of an elliptical tool-path like the one used in the nanocoining experiments is shown in FIG. 3.

Figure 3:
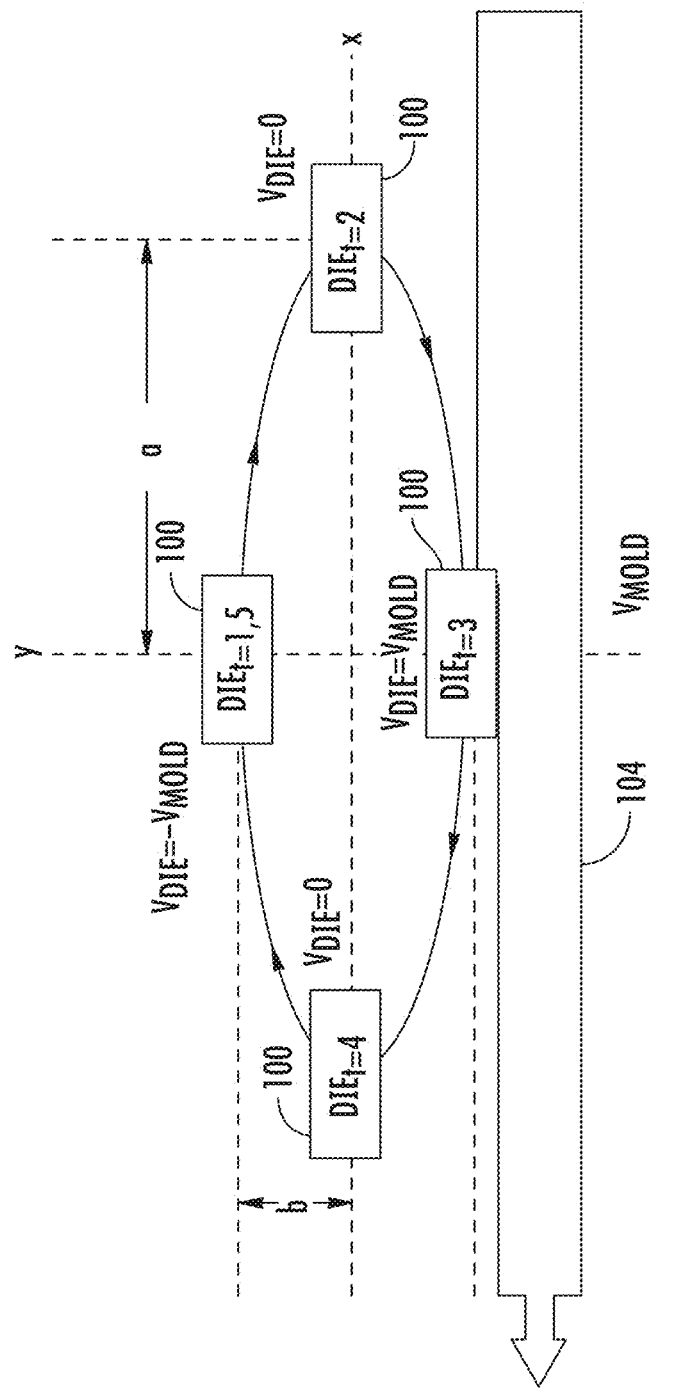
FIG. 3 is a diagram illustrating an elliptical tool path for a die when imprinting nanometer scale features in a moving substrate according to an embodiment of the subject matter described herein.

FIG. 3 shows die 100 at various times in the indentation cycle traveling along the elliptical path with components of motion parallel (x-direction) and perpendicular (y-direction) to the surface mold 104. The shape of the ellipse as a function of time can be defined using $$x(t)=a \sin(\omega t) \quad (1)$$

$$y(t)=b \cos(\omega t) \quad (2)$$

where a is the amplitude of the ellipse in the x-direction, b is the amplitude in the y-direction, $\omega$ is the indentation frequency in rad s$^{-1}$ and t is the time. The purpose of adding motion in the x-direction was to match the die velocity with the mold velocity at the time of contact. The velocity of the die (in the x-direction) during the indentation cycle was found by differentiating equation (1) with respect to time $$v_{die}(t)=\omega a \cos(\omega t) \quad (3)$$

Figure 4:
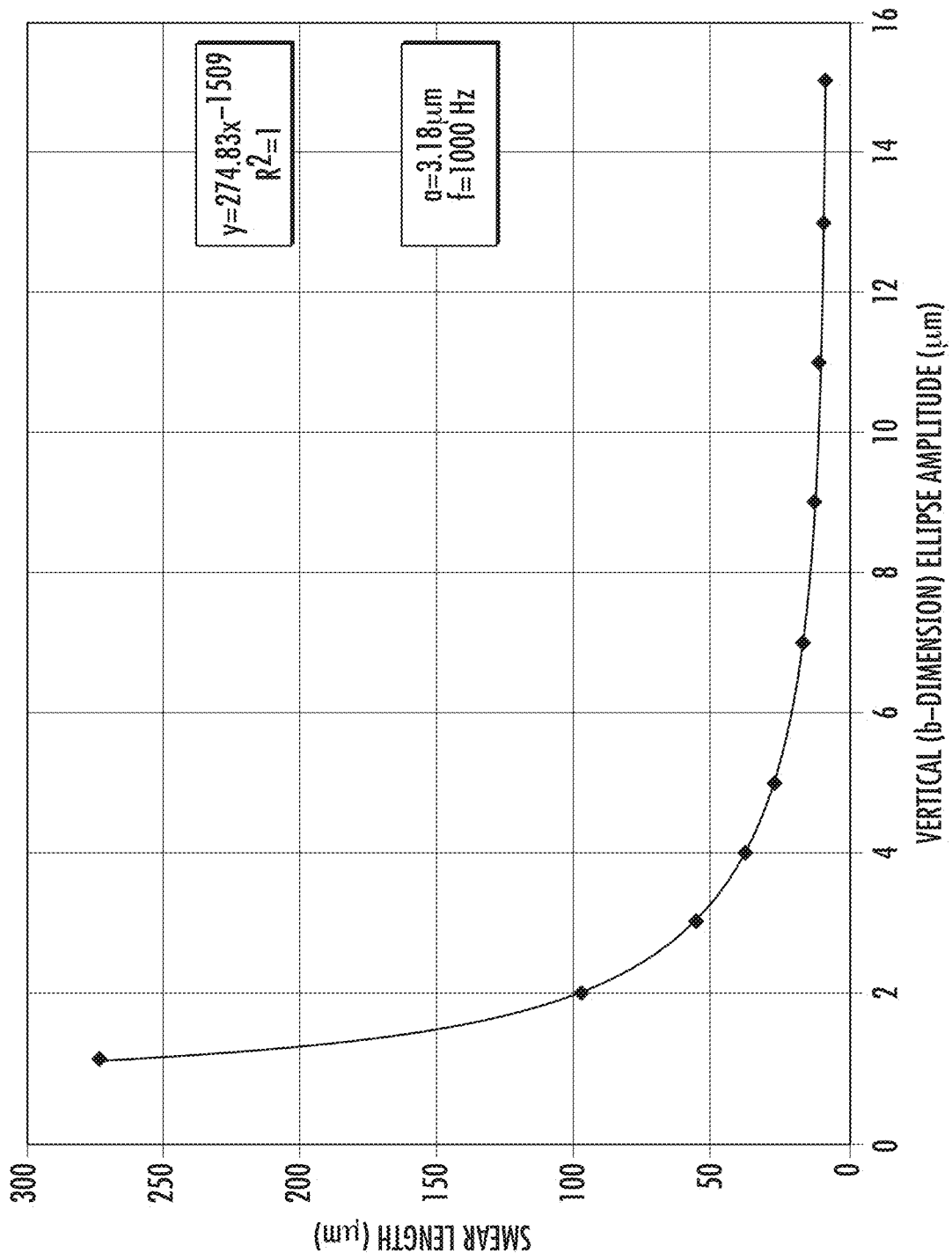
FIG. 4 is a graph of vertical ellipse amplitude versus smear length when imprinting nanometer scale features in a workpiece according to embodiment of the subject matter described herein.

According to equation (3), the velocity of die 100 in the x-direction is constantly changing throughout the indentation cycle and because contact between the die and mold takes some amount of time, the velocities cannot theoretically match during the entire contact. The solution to this problem is to decrease the time the die and mold are in contact which decreases smear. To minimize the velocity mis-match, the ellipse is made to be tall (b as large as possible) so that the contact time is small. A simulation of smear versus b amplitude was performed and the results are shown in FIG. 4.

The smear length is calculated using the difference in velocities multiplied by the contact time. Making the b dimension larger will produce a narrow ellipse and decrease the contact time, thus decreasing the smear, as seen in FIG. 4. A b dimension of 3:42 µm was the largest vertical dimension possible which theoretically should produce 50 nm of smear, as seen in FIG. 4.

Knowing that matching the speed of the die with the speed of the mold during contact is not possible, the best approximation was to set the velocity of the die equal to the maximum x-direction of velocity given by $$v_{die,max}=\omega a \quad (4)$$

The horizontal a dimension (FIG. 3) in equation (4) is critical to achieving the best possible velocity match between the die and the mold. The velocity of the mold can be thought of as distance divided by time. For each indentation cycle it is desired to move the die one die length, l, in the x-direction. One indentation cycle is the period of the indentation frequency. The mold velocity is then expressed as $$v_{mold} = \frac{l}{T} \quad (5)$$

where l is the length of the die and T is the period of the indentation frequency. Finally the a dimension of the ellipse can be found by setting equation (4) equal to equation (5) and re-arranging to produce $$a = \frac{l}{2\pi} \quad (6)$$

For the die used in these experiments (l=20 µm) the a dimension was equal to 3:2 µm.

Figure 6:
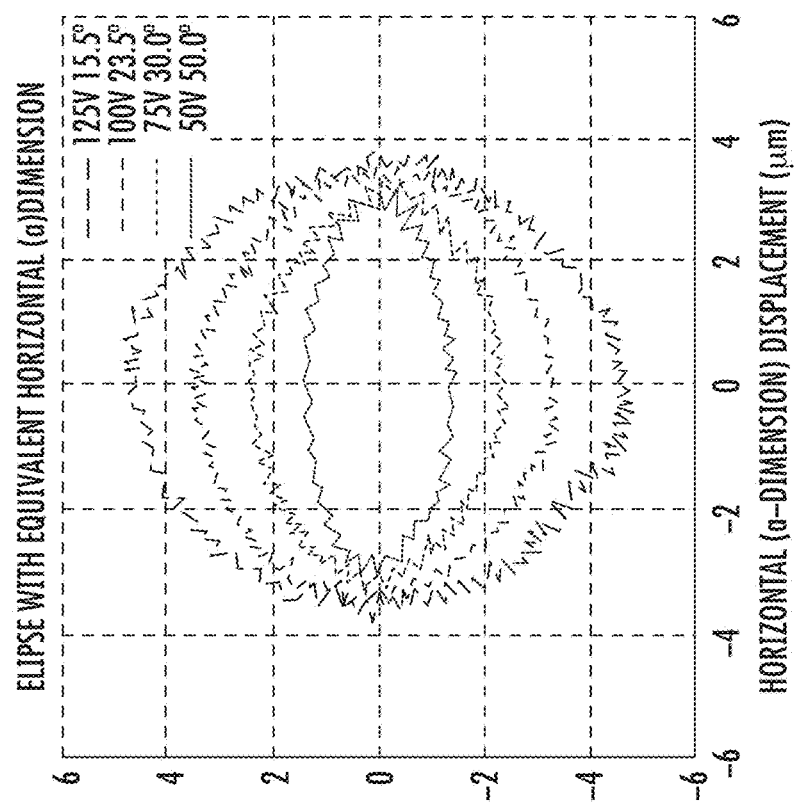
FIG. 6 is a graph of horizontal displacement versus vertical displacement for imprinting nanometer scale features in a workpiece according to an embodiment of the subject matter described herein.
Figure 5:
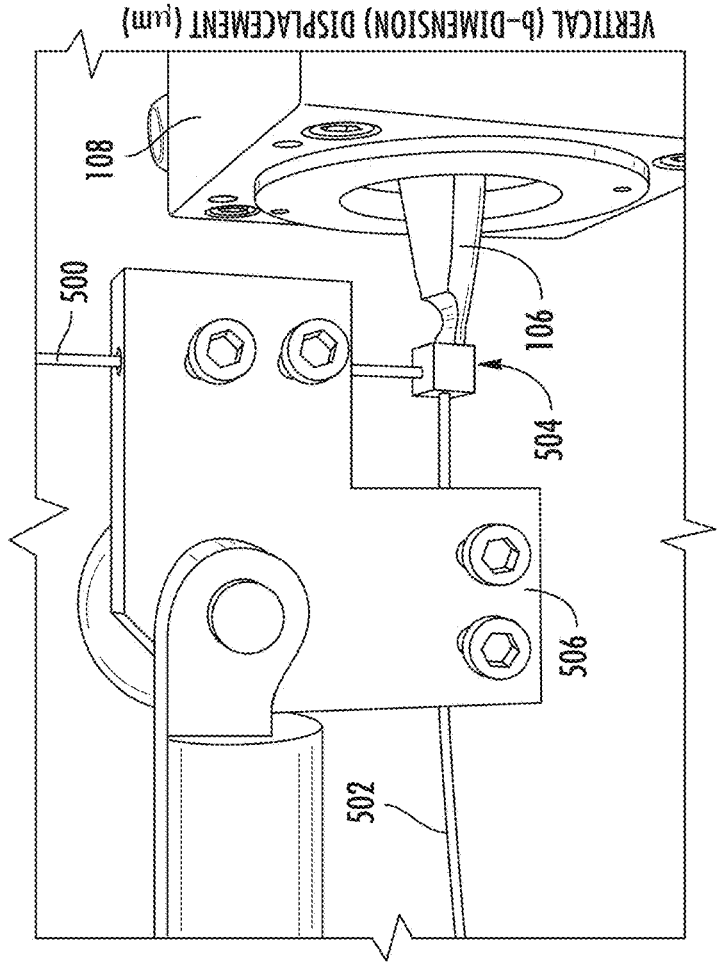
FIG. 5 is diagram of an actuator, light probes, and a tool holder for imprinting nanometer scale features in a substrate according to an embodiment of the subject matter described herein.

In one exemplary implementation, actuator designed for elliptical vibration assisted machining (EVAM) called the Ultramill was used to generate the elliptical tool-path. FIG. 5 is a diagram illustrating a close-up view of elliptical actuator 108, tool holder 106, and light probes 500 and 502. The Ultramill is a non-resonant actuator driven by two piezo stacks kinematically coupled to tool-holder 106 and pre-loaded with a titanium diaphragm. When the two piezo stacks are driven out of phase, a combination of extension and tilt produces an elliptical path. The shape of the path can be adjusted by varying the phase and amplitude of the AC drive signals. The correct phase angle and signal amplitude were found by using a two channel MTI Instruments photonic sensor to measure the motion of tool-holder 106. An acrylic cube 504 was glued to the end of tool-holder 106 and covered with reflective tape, as shown in FIG. 5. Two light probes 500 and 502 were then mounted in a fixture 506 which held them 90° apart and the motion was measured while varying the phase angle and signal amplitude. FIG. 6 also shows multiple measurements taken with the photonic sensor at different amplitudes and phase angles that all produce an ellipse with the correct a dimension. The ellipse used is indicated in FIG. 6 and does not have the largest b dimension. The ellipse with the largest b dimension was not chosen because this was near the operating limit of the Ultramill and the tool-path showed some erratic behavior.

2.3. Nanoform 600 DTM

Nanocoining experiments were performed using the Ultramill actuator mounted to the y-axis of a Nanoform 600 four-axis DTM as illustrated in FIG. 1B. The Nanoform has three linear axes and one rotation axis in the form of an air bearing spindle 112. The x- and z-axes are supported by hydrostatic oil bearings and driven by precision ball-screws and laser interferometers are used for position feedback on both axes. The y-axis was purchased from Moore Nanotechnology Systems and uses a hydrostatic oil bearing for the linear motion. Position feedback is achieved through an optical encoder which, when interpolation is used, can achieve step sizes of 1.1 nm. An image of the Nanoform experimental setup is shown in FIG. 6.

FIG. 1B shows a flat 1:2500 diameter electroless (EL) nickel mold 104 mounted on the vacuum chuck on the Nanoform spindle 112. The Ultramill is indenting on a flat, rotating surface so indents were created in a spiral pattern just as in single point diamond turning. This was achieved by moving the die outward radially as the part turned on the spindle.

3. Alignment

3.1. Angular Alignment

One of the more challenging aspects of the nanocoining process is aligning the die with respect to the mold surface. The die must be aligned about three axes of rotation, as shown in FIG. 7(a). The coordinate system shown is that of the Nanoform DTM.

Any rotation of the die about the Y($\theta_{xz}$) or X($\theta_{yz}$) axes will cause the die to be tilted with respect to the mold surface. If the tilt is significant, as shown in FIGS. 7B and 7C, then a portion of the features will not contact the mold leaving a partial imprint. Based on the length of the structured area (20 μm) and the height of the nanofeatures (360 nm) an angular tolerance of 0.01° was chosen to ensure total transfer of features. A tilt error of 0.01° would produce a maximum height difference in nanofeatures of less than 4 nm as follows:

$$\text{error} = 20 \text{ μm} \tan(0.01°) = 3.5 \text{ nm} \quad (7)$$

Figure 8A:
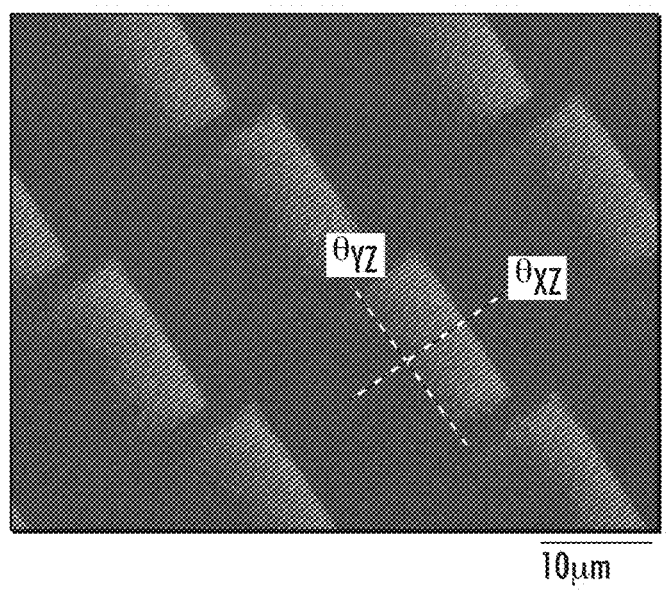
FIGS. 8A-8C illustrate scanning electron microscope (SEM) images of features imprinted on a substrate for different alignment angles of a die used to imprint the nanometer scale features.
Figure 8B:
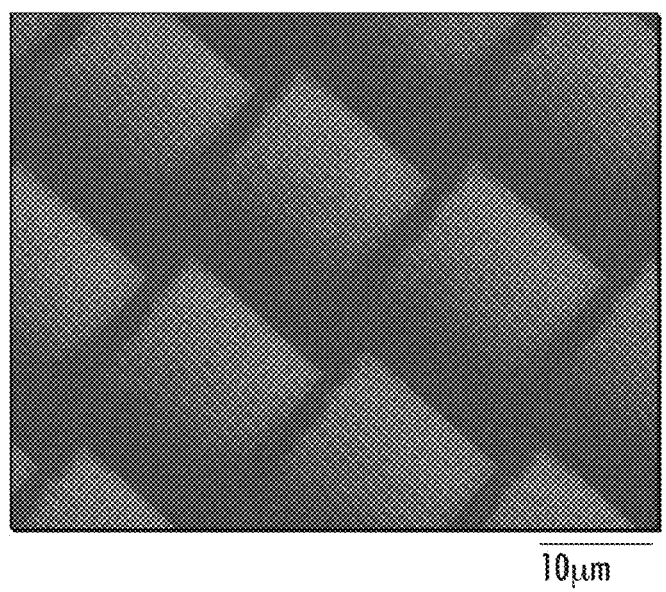
Figure 8C:
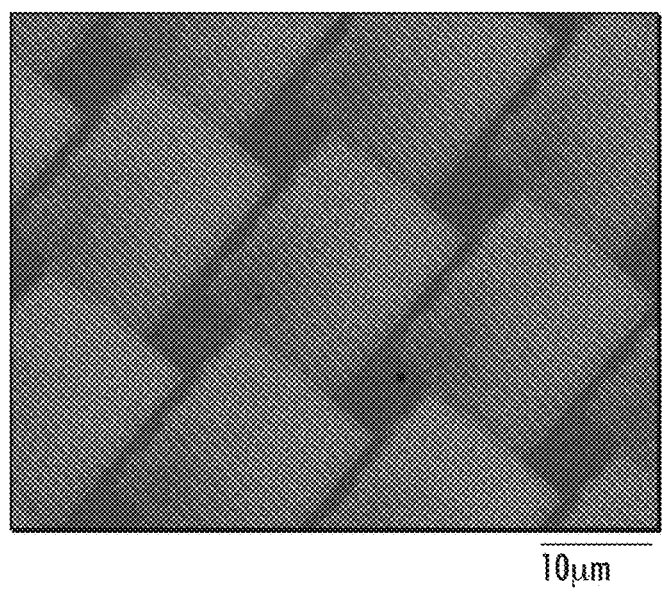

An alignment fixture capable of rotating the die about the X and Y axes was built to compensate for tilt of the die. Initial indents were performed to measure how much tilt was present. After examining the indents in an optical microscope, adjustments were made to the alignment fixture and more indents were created. This process was repeated until the Ultramill produced complete indents (the entire indentation face had made contact) implying that the actuator had been aligned so that the die was parallel to the mold upon contact. FIGS. 8A-8C show some iterations of the alignment process.

The first test image (FIG. 8A) is an SEM image of the initial misalignment with the axes of the die, labeled as $\theta_{YZ}$ rotation about the x-axis, $\theta_{XZ}$ rotation about the y-axis, and $\theta_{XY}$ rotation about the z-axis (see FIGS. 7A-7D). Initially $\theta_{XZ}$ was well aligned but $\theta_{YZ}$ misalignment caused partial transfer of features. $\theta_{YZ}$ was adjusted until all features were visible (FIGS. 8B and 8C). The angles to which the Ultramill had been adjusted were recorded for future use.

Rotation about the Z-axis ($\theta_{XY}$) was important for locating indents with respect to others and is called indent registration. The goal is indents created with no gaps to form a seamless area of nanofeatures. This is not possible if the die is rotated in the $\theta_{XY}$ direction which will result in gaps that can only be accounted for by overlapping. While it is not known whether overlapping the features will have a negative impact on the desired property of the surface, the goal was to avoid the need to overlap. Alignment of $\theta_{XY}$ was handled by ensuring that locating features on the tool-holder were square and adjustments were made by rotating the PZT stacks in the Ultramill housing.

3.2. Indent Depth

Figure 9A:
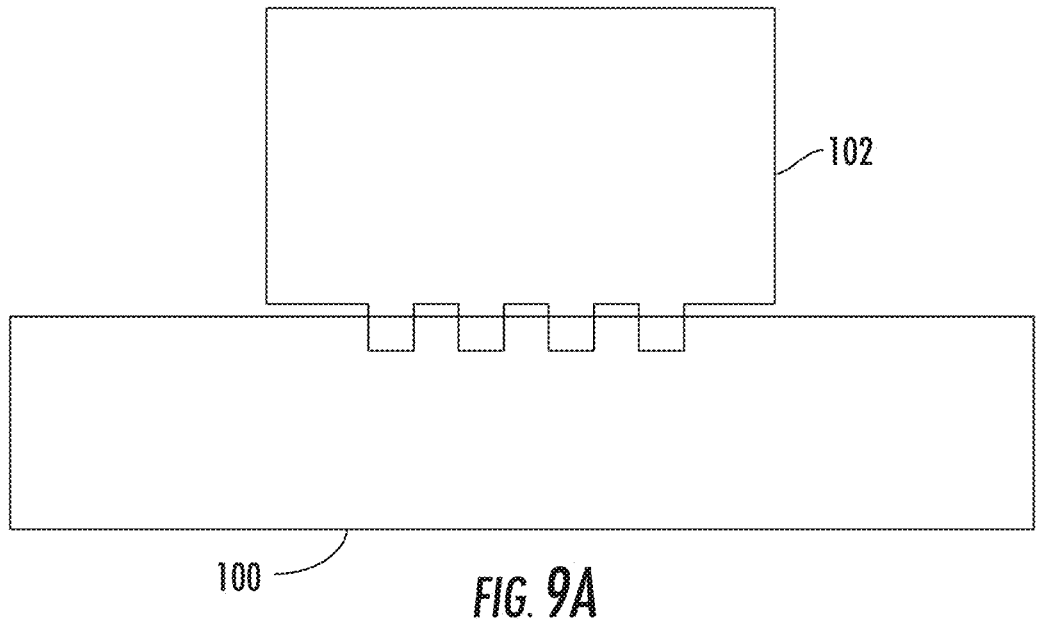
FIG. 9A is an image of a die just before features have been stamped into a mold and FIG. 9B is an SEM image of the indents created where the die bottomed out resulting in border marks around the border of each indent.
Figure 9B:
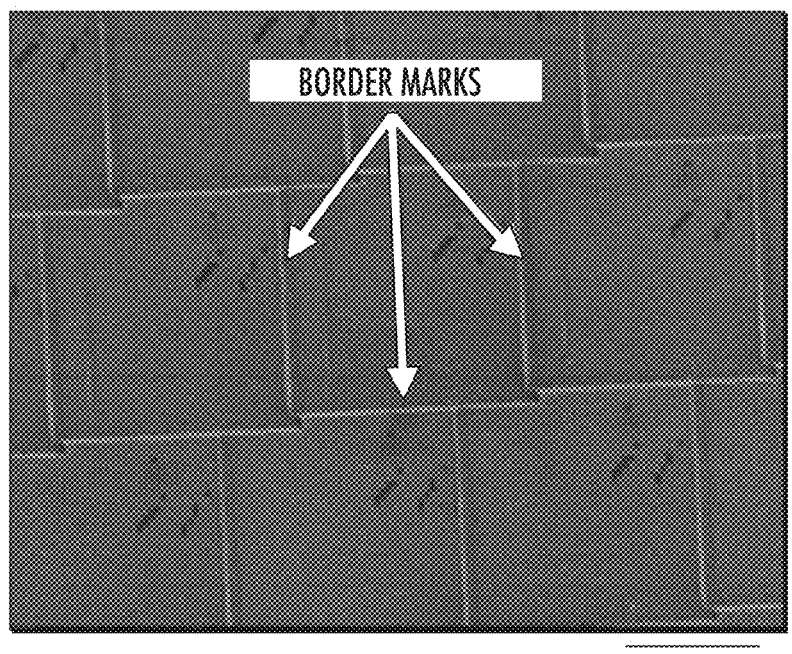

It is desirable to ensure full imprinting of a mold surface to have depth control to create a continuous region of indents. Without control, the die may come into and out of contact with the mold leaving un-indented regions. Also, if the die is pushed so far into the mold that the border surrounding the features hits (die 'bottomed out') a mark will appear around the perimeter of each indent caused by plastic deformation from edge stress concentration. FIG. 9A is an image of the die 100 just before the features have been completely stamped into the mold 104. FIG. 9B is an SEM image of indents created where the die was bottomed out resulting in the indicated border marks around the perimeter of each indent.

Another undesirable result of bottoming out the die is the large volume of displaced material. When only features are indenting the deformation is localized around each nanofeature but as soon as the border touches the entire die begins to displace material resulting in a surface which is no longer flat. An example of this effect can be seen in FIG. 10 which is a Zygo New View SWLI measurement of a section of indents created with a test die that had a 100 μm×100 μm face with no features (flat).

Figure 10:
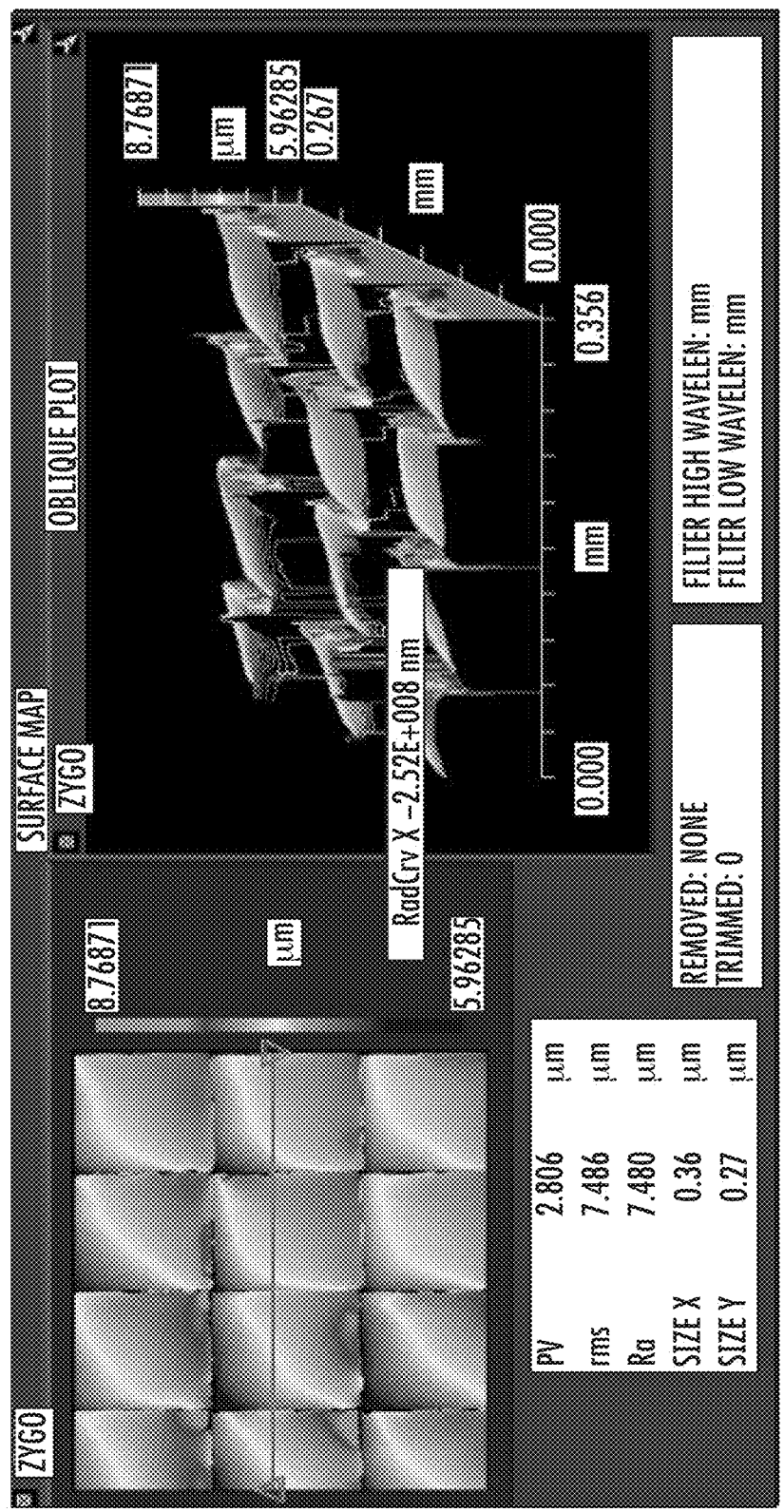
FIG. 10 is a computer screen shot illustrating images of indents created in a test die using nano-imprinting according to an embodiment of the subject matter described herein.

The flat die used to create the indents in FIG. 10 acts like a nanostructured die that has been bottomed out where the flat face on the flat die produces the same effects as the border of the nanostructured die. When the flat die presses into the mold there is no place for the incompressible material to flow except outwards and upwards. When this procedure is performed in an array (2D), as shown in FIG. 10, repeatable deformation occurs that is a combination of material displacement in two directions causing the indents to tilt about their diagonal. The result is a surface with a series of tilted indents whose magnitude of deformation trumps the nanofeatures degrading the desired property of the surface. The optimal procedure is to indent sufficiently so that the mold material almost fills the volume surrounding the nanofeatures so that the overall surface level of the mold remains unchanged.

A form of feedback control has not yet been developed for this process so depth control is handled in two ways. First, steps were taken to ensure the DTM had come to thermal equilibrium by running the spindle at machining conditions for at least 1 hour before the finishing machining pass so that the mold had minimal form error. The diamond turned mold was measured in an interferometer to make sure that the form error was less than 100 nm. The second method of depth control is to maintain piezo stack temperature. The Ultramill's piezo stacks are liquid cooled using a dielectric heat transfer fluid and a PID controlled thermoelectric chiller. The gains for the thermoelectric cooler were tuned for the particular fluid, flow rate and Ultramill operating conditions and were tested by running the Ultramill for 1 h and measuring the temperature change of the heat transfer fluid inside the actuator as well as the mean displacement of the die. The result was temperature control of the piezos to within 0.1° C. and less than 100 nm of thermal expansion and contraction of the Ultramill tool.

In future experiments where the outside surface of a cylinder is indented, it may be necessary to compensate for run-out errors of the part. A cap gage could be used to measure the run-out of the cylindrical surface and an auxiliary axis could be used to move the Ultramill for compensation.

4. The Nanocoining Process

4.1. Centering and Depth Calibration

Before an indentation experiment could be performed, it was critical to have the die centered with respect to the mold. This was carried out by indenting two concentric rings and measuring the error in the two radii from the expected ones using a Zygo New View SWLI. The measured error was then used to set the center position of the mold. This method is used frequently in diamond turning and proved equally effective during nanocoining.

The depth at which indents will occur is set as a z-axis offset on the Nanoform DTM. Setting of the depth is performed after the die has been centered by indenting rings at various depths and keeping track of which ring was indented at which depth using the z-axis positions on the Nanoform DTM. The part is removed from the vacuum chuck taking care to note the angular orientation and vacuum pressure and examined under a microscope (500×). The nanocoined rings are examined and the one which can produce the best features without die border marks is chosen. The depth associated with this ring is then set as the depth at which the die will indent for the experiment.

4.2. Indenting Motion Program

Machine code was written to move the Ultramill using the axes of the Nanoform so that large rings of indents could be created. The mold was a rotating flat so the best type of geometry to indent was a ring; future indentation experiments will use the outside surface of a rotating cylinder. Indenting on a rotating flat posed some issues because the speed of the mold will change as the radial position changes (for a constant spindle speed). This was a problem because the actuation frequency of the die (and thus die velocity) remained constant and the goal was to match the velocity of the mold. The solution was to change the spindle speed as a function of the radial position of the die using $$\omega(r) = \frac{fl}{r}\frac{60}{2\pi} \qquad (8)$$

where $\omega$ is the spindle speed in rpm, f is the actuator frequency in Hz, l is the die length in mm and r is the radial position in mm. Equation (8) was used in the machine code to update the spindle speed and keep the mold velocity constant and equal to the die velocity. The feed-rate of the die (velocity of radial motion of the actuator) must also be updated since the spindle speed is not constant throughout the process. It is desired to move the Ultramill one die width per revolution of the spindle to ensure total coverage. The expression used in the machine code was $$v_{feed}(r) = \frac{wlf}{r}\frac{60}{2\pi} \qquad (9)$$

where $v_{feed}$ is the feed-rate in mm min$^{-1}$ and w is the width of the die in mm. Use of equation (9) in the machine code ensured that each ring of indents would be created at the outside edge of the previous ring. Indent registration was controlled using equations (8) and (9) with the goal of completely tiling the target indentation area. Overlap was introduced by changing either the w or the l variable in equations (8) and (9). Changing the l or w parameter would introduce overlap in the stamping or cross-feed directions respectively. For example, if 1 μm of overlap was desired in the cross-feed direction, w was changed to 19 μm instead of 20 μm. This method was identical for overlap in the stamping direction except that l was changed.

5. Indentation Results

The nanocoin process was used to indent a 6 mm wide ring on a 1.25″ diameter electroless nickel sample at a rate of 1 kHz. The sample was stainless steel plated with a 380 μm thick layer of nickel and had a Vickers hardness of $H_v$=457. The ring started at a radius of 6 mm and ended at a radius of 12 mm, resulting in an indented area of 339 mm². Based on this area and the area of the die the total number of indents was approximately 1.12 million created in 20 min. Once the part had been machined replicates were made using a UV curable material. An image of the indented part and replicates can be seen in FIGS. 11A and 11B.

The part and replicates shown in FIGS. 11A and 11B exhibit diffraction because the spacing of the current features (500 nm) is not below the wavelength of visible light. Indents created in the future with smaller feature spacing will not be diffractive because their feature spacing will be less than the wavelength of visible light. The nickel plated mold in FIG. 11A was measured in a scanning electron microscope (SEM) and the results are shown in FIGS. 12A and 12B.

Figure 12B:
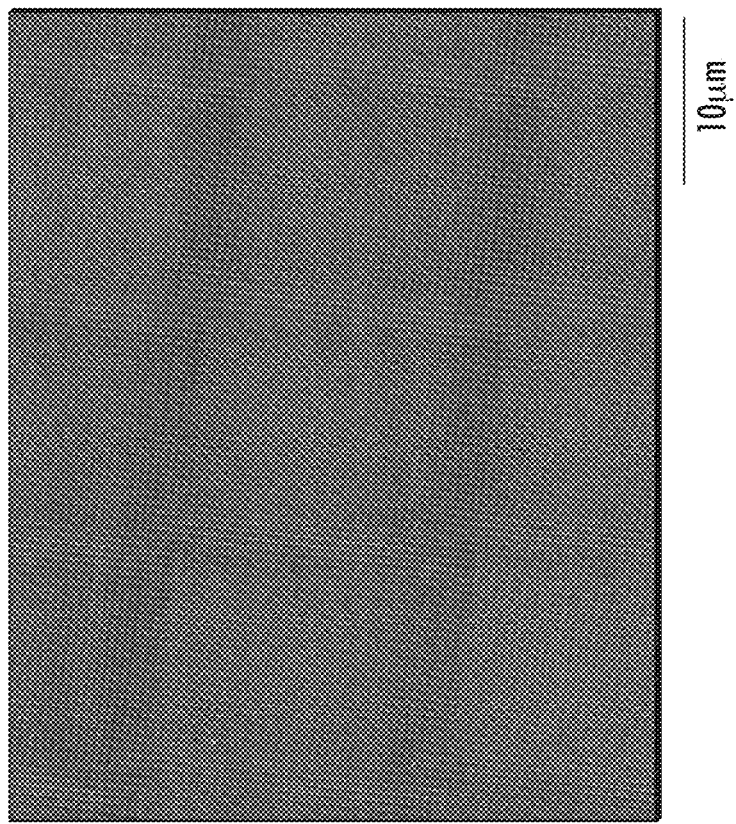
FIGS. 12A and 12B are SEM images of the features imprinted in the substrate in FIG. 11A.
Figure 12A:
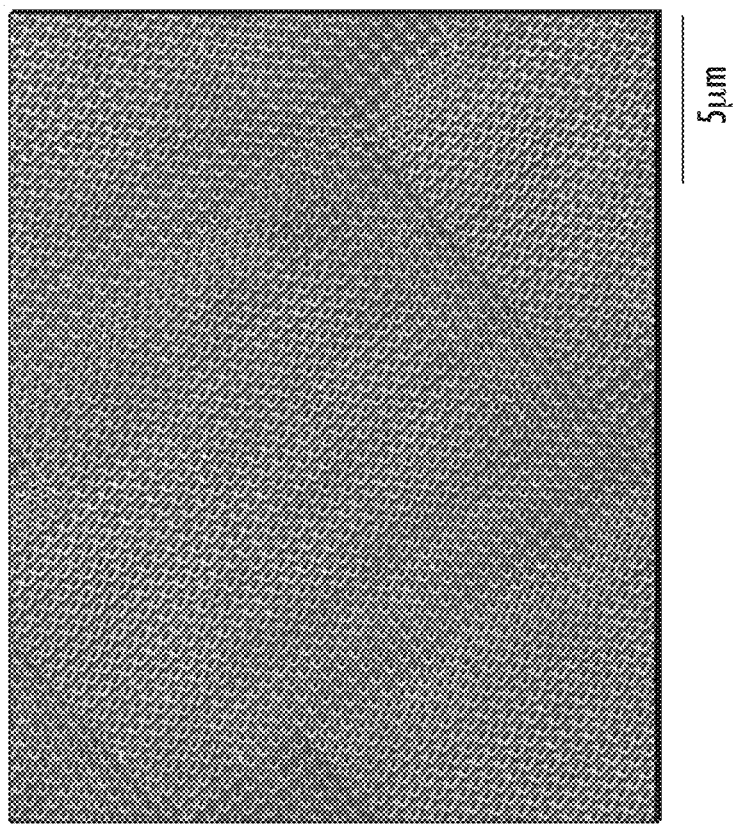

The nanofeatures shown in FIG. 12A were created with the die in FIG. 2 so the shape is a conical hole. FIG. 12A shows mold material sticking out of the surface around the hole and resembles burring, which is a very different effect from the typical pile-up caused by dies [19]. Normally it would be expected to see the material pushed away from the feature and up but in this case it appears as if the material mostly moved up and formed a free surface. While this effect has not been defined, it has been suggested that the high strain rate may cause the mold material to heat and flow in a more fluid manner. It is also not understood whether this effect is detrimental to the overall surface quality or whether the burrs can be removed with polishing or etching. The areas in FIGS. 12A and 12B that appear to be the borders of the indents are overlapped regions; this was done intentionally (2 μm) to ensure total coverage of the mold. The overlapped sections resulted in areas which had a higher density of features because they had been indented twice and were easily recognizable in the SEM images.

Although only nanocoining results on an electroless nickel mold material are presented in this work, other materials such as hard plated copper and brass have also been used. The use of different materials defined an effect called 'pick-up' which resulted from material from the mold surface becoming lodged between the nanofeatures on the diamond die. The material filled the voids on the die ultimately making it ineffective in the feature transfer process. After examining the Vickers hardness of the materials, it was found that harder materials exhibited less pick-up. Thus, electroless nickel was the preferred material with hard plated copper also exhibiting favorable results. The nanocoining results showed that materials with Vickers hardness values of 250 or higher were less likely to adhere to the nanofeatures on the die.

Figure 11B:
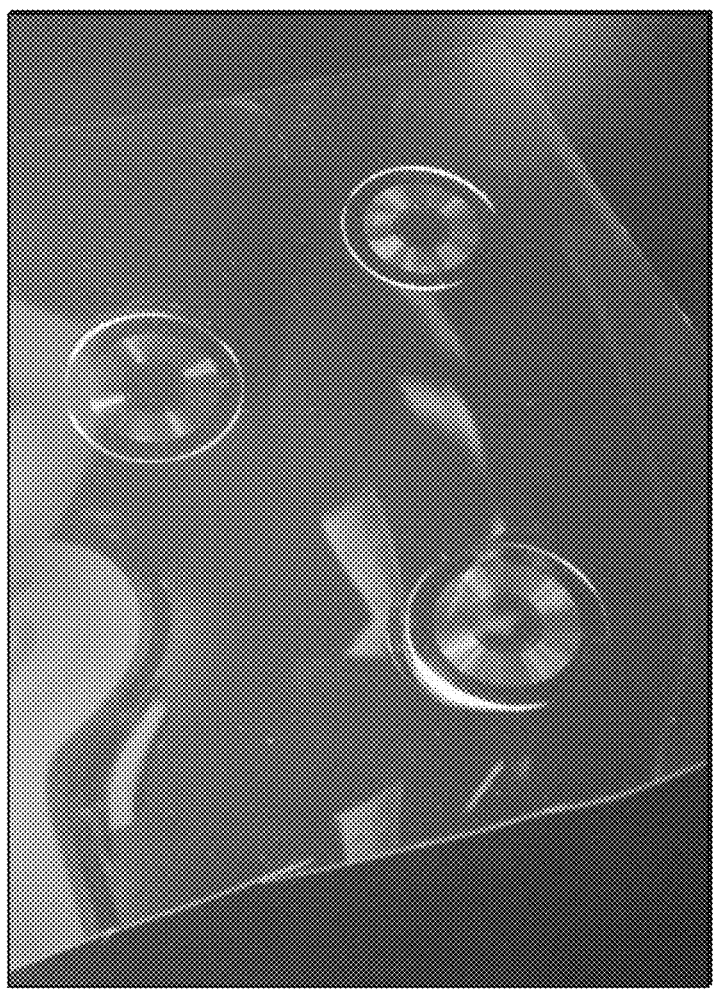
FIGS. 11A and 11B illustrate images of samples imprinted with nanometer scale features according to an embodiment of the subject matter described herein.
Figure 11A:
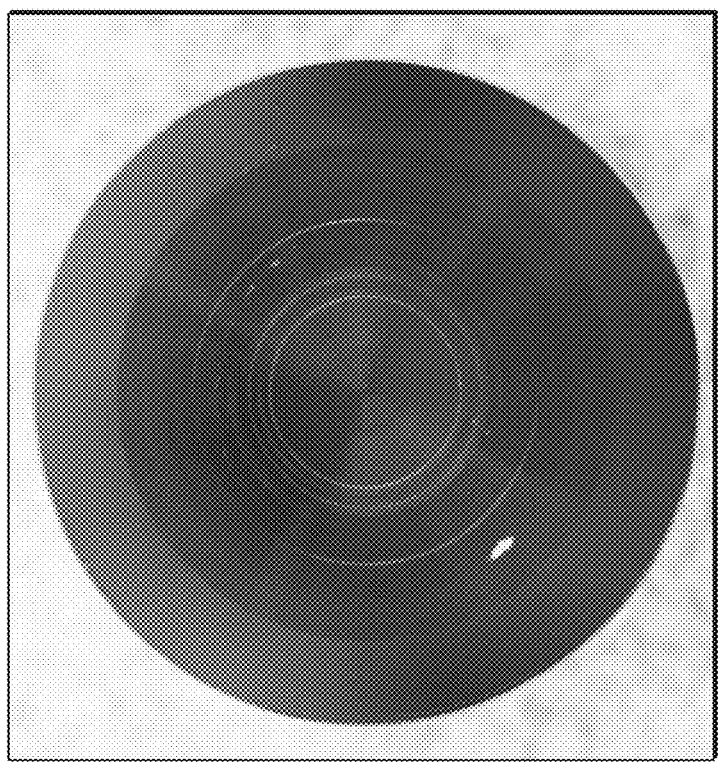
Figure 13B:
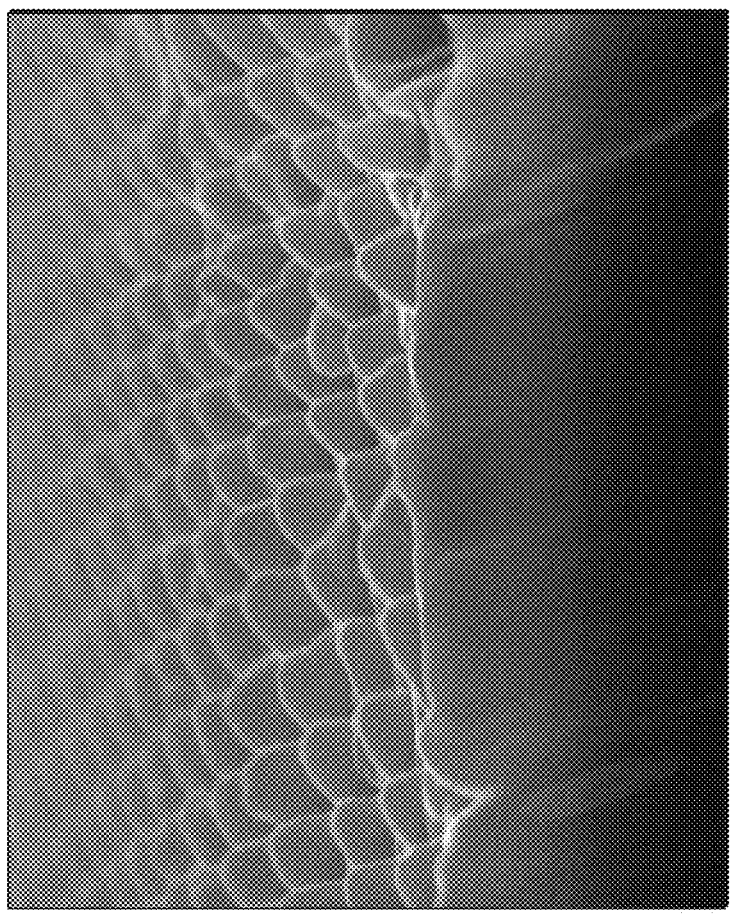
FIGS. 13A and 13B are SEM images of the nanometer scale features in FIG. 11B.
Figure 13A:
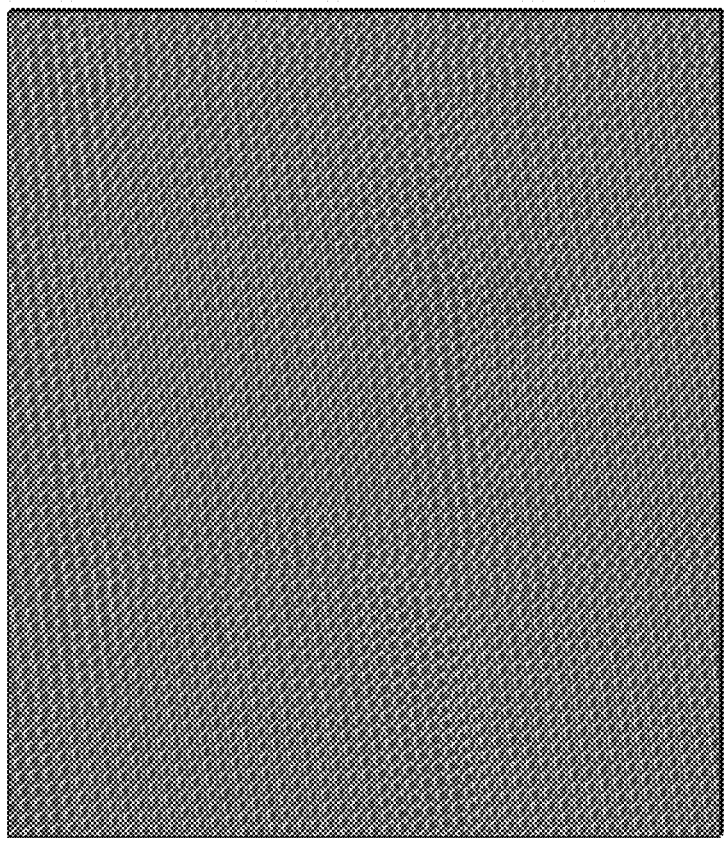

The replicates shown in FIG. 11B were also examined in the SEM, as shown in FIGS. 13A and 13B.

The large arrays and shape of the features in FIGS. 13A and 13B resemble those found in moth eyes [2]. FIG. 13A also shows that the overall form error of the original diamond turned mold was maintained because the die's edges did not touch. This also implies that the temperature control of the piezo stacks allowed the actuator to hold position. The only deformation which occurred was at the nanofeature level so no large displacement of the surface was observed. Features were replicated in the overlapped areas which were initially thought to be a problem during transfer. FIG. 13B is a side view of a sectioned piece of the plastic replicate showing the profile of the features.

It was desired to quantify the behavior of the material around each nanofeature shown in FIG. 12A, so an atomic force microscope (AFM) was used to quantify the depth data. AFM measurements of the side of the replicate touching the mold (underside, bumps) and an inverse image representing what the mold surface would look like can be seen in FIG. 14.

Figure 14A:
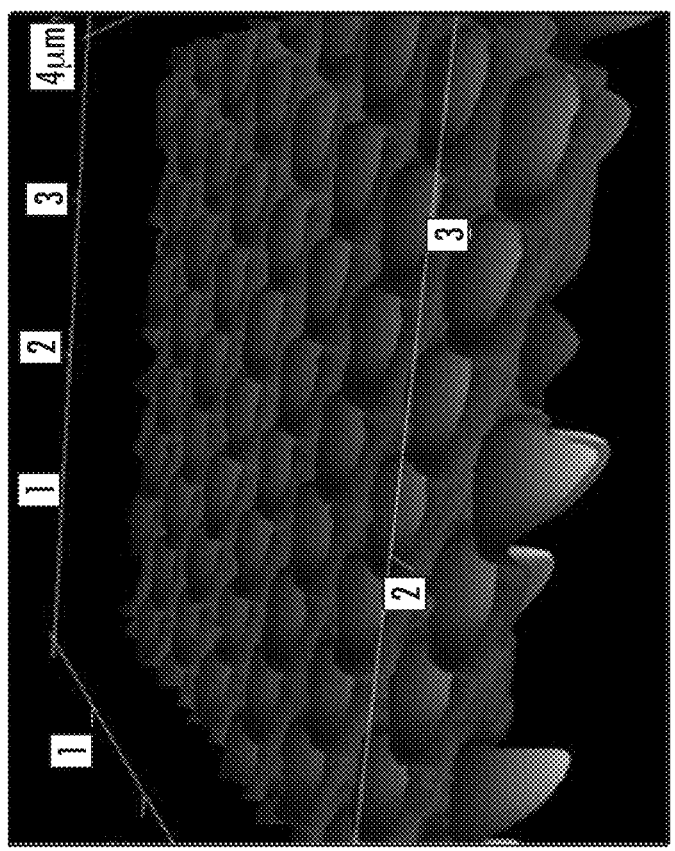
FIGS. 14A and 14B are atomic force microscope images of the features illustrated in FIG. 11A.
Figure 14B:
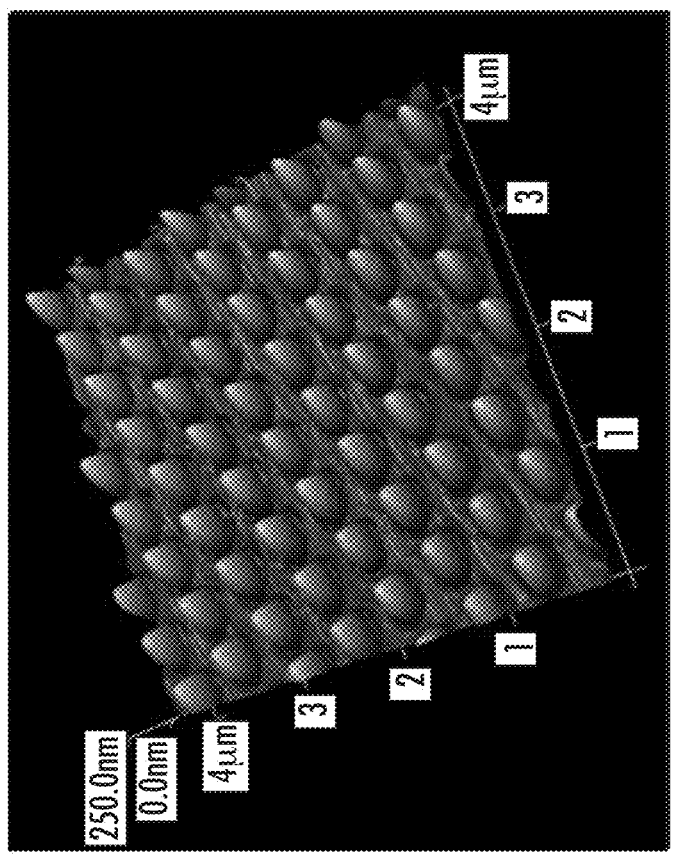

The AFM measurement in FIG. 14B illustrates how the UV curable material formed to the surface of the mold well enough to show the displaced material around each of the nanofeature impressions. The same is true of the underside of the replicate (FIG. 14A) which shows them as depressions around the nanofeature bumps. Data from the AFM measurement show the depth of the depressions to be approximately 50 nm and the peaks of the nanofeatures to be 150 nm which are similar to moth eyes. It should also be noted that the individual features are not symmetric. The features on the die are cones with circular bases but the features in FIG. 14A appear to have oval bases. This is caused by the smear from non-instantaneous contact time as discussed earlier. It was theorized that for the b dimension used approximately 50 nm of smear would be produced. This dragging of the features through the surface during contact would create replicates as shown. Whether this will have an effect on the surface property is unknown but if fully symmetric features are necessary than future dies can be fabricated with non-symmetric nanofeatures which when smeared would create symmetric mold features.

The replicates created in FIGS. 14A and 14B are not optimized for visible light anti-reflection since the 500 nm spacing falls in the middle of the visible spectrum. Their effectiveness was tested, however, with a laser whose 633 nm wavelength was larger than the spacing of the nanofeatures. The laser illuminated regions of the replicate with and without nanofeatures and the reflected light was measured using a laser power meter. The UV material reflected 9.7% of the 633 nm wavelength light in regions without nanofeatures. The amount of reflected light dropped to 7.7% when the laser was directed onto regions with nanofeatures, amounting to a 2% decrease. This amount of reduction is consistent with other publications [10-12]. Future experiments will be performed with indenters tailored for anti-reflection by adjusting the spacing and height of the nanofeatures which affects the broadband reflection properties [20]. The scope of this work was to develop the process.

Ideally, the mold would be a drum which would have nanofeatures imprinted on the outside surface which would then be used to roll-transfer structures such as those seen in FIG. 14(a) to a thermally softened sheet of plastic. Indenting on the outside surface of a drum is attractive because there is no need for rotational speed and feed-rate compensation since the drum has a constant radius. Once the drum has been covered in nanofeatures it can be used as a mold which is where a high throughput is achieved.

6. Conclusions

Nanocoining is a new process that could be used to mass produce large areas of nanostructured coatings economically. A diamond die was attached to a 1 kHz actuator which had an elliptical path that matched the die's velocity with the mold velocity. Equations were developed to define the shape of the elliptical tool-path and the actuator was calibrated to produce this shape. Alignment techniques were used to make the die parallel to the mold by rotating the die about two axes of rotation to within 0.01°. Depth was maintained throughout the indentation process by ensuring that the diamond turned mold had very little form error (much less than the height of the features) and by using a closed loop thermoelectric chiller to keep the actuator's PZT stacks' temperature constant to within 0.1° C. These measures were then used to create areas of indents on a rotating electroless nickel sample at 1 kHz using the Nanoform 600 DTM. The indented nickel mold and replicates created using a UV curable epoxy were examined in an SEM and AFM and the results showed that the mold was able to successfully transfer features to replicates. The replicates also transferred the shape of the material displaced around each nanofeature which may or may not be an issue but still must be studied.

Alternate Actuator Designs

In the example described above with respect to FIG. 1B, the die is driven to imprint features in a flat workpiece while the workpiece is rotated by a second actuator. In an alternate implementation of the subject matter described herein, the actuator may be used to imprint the sidewall of a cylindrical drum. FIG. 15 illustrates this concept. In FIG. 15, actuators 108A and 108B drive die 100 in the direction orthogonal and parallel to the sidewall of cylindrical mold 1500 to imprint patterns on a sidewall of cylindrical mold 1500. Cylindrical mold 1500 is then used to transfer positive structures on a surface 1502.

In the examples illustrated in FIGS. 1B and 15, actuator 108 is mechanically driven at sub-resonant speeds of about 1 kHz to imprint about 1.6 million features per second in a substrate, assuming a 40×40 or 1600 feature die. In an alternate implementation, actuator 108 may comprise a resonant structure driven at its resonant frequency. In such an implementation, the resonant frequency may be about 50 kHz, such that 80 million feature per second may be imprinted in a substrate, assuming a 40×40 die. FIGS. 16-19 illustrate resonant actuators that are designed to resonate at about 50 kHz.

Figure 16:
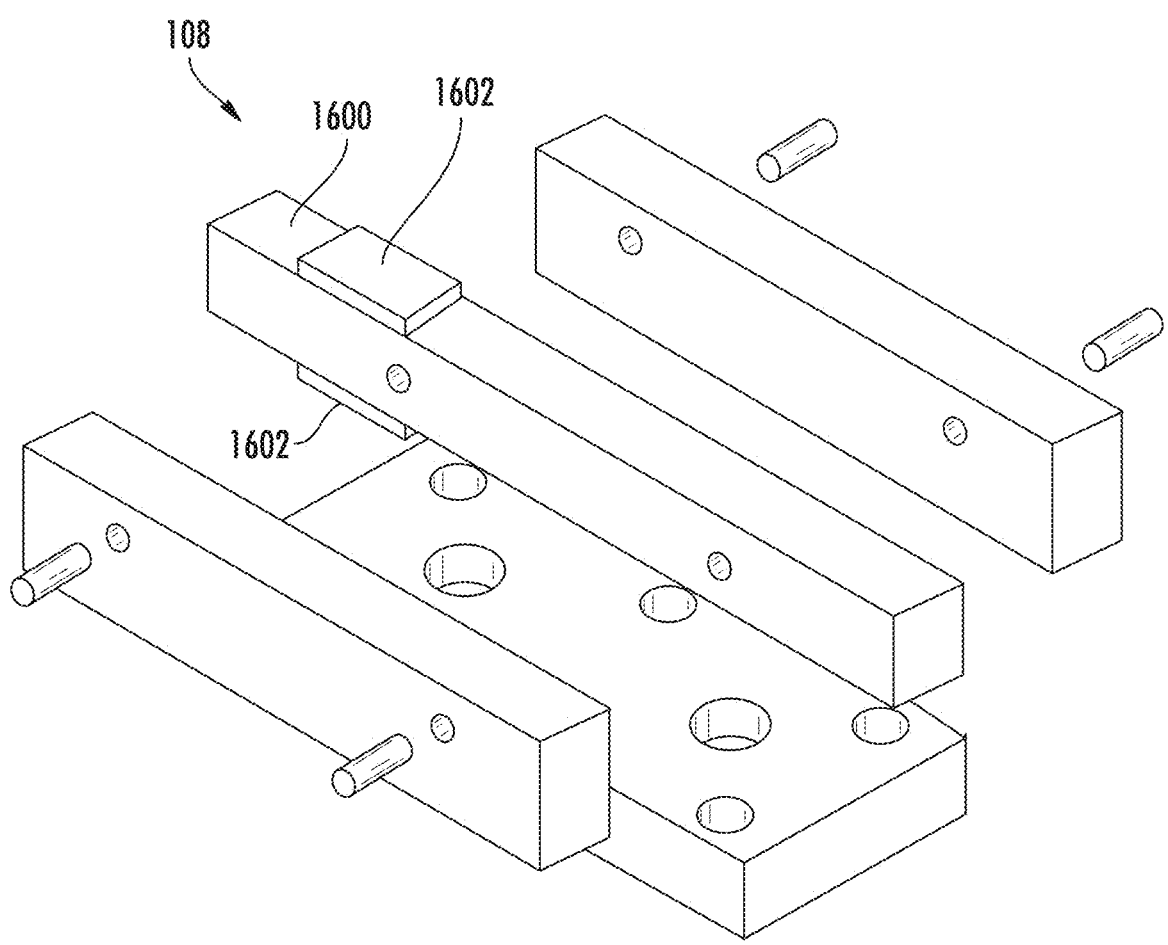
FIG. 16 is a schematic diagram illustrating a resonant actuator design according to an embodiment of the subject matter described herein.

Desirable properties of an actuator are that the actuator be a resonant structure that is free and move in two directions, the movement in the two directions has common modes or flexing points, the resonant frequency of the actuator is substantially the same in the two directions, and the resonant frequency is about 50 kHz. In one embodiment, the actuator comprises a piezoelectric material and a beam where the piezoelectric material is excited to move the beam at a resonant frequency of the beam in two directions. FIG. 16 illustrates one example of an actuator 108 that comprises a beam 1600 with piezo elements 1602 located on upper and lower surfaces of the beam 1600. When piezo elements 1600 are excited with a sinusoid, beam 1600 bends, resulting in deflections, as simulated in the example illustrated in FIG. 17. The bending produces the elliptical motion of the die that is mounted on the end of beam 1600, which is suitable for imprinting flat or curvilinear mold surfaces. In one experiment, the resonant frequency of beam 1600 was measured to be 39,010 Hz in the longitudinal direction and 28,190 Hz in the bending direction.

Figure 18:
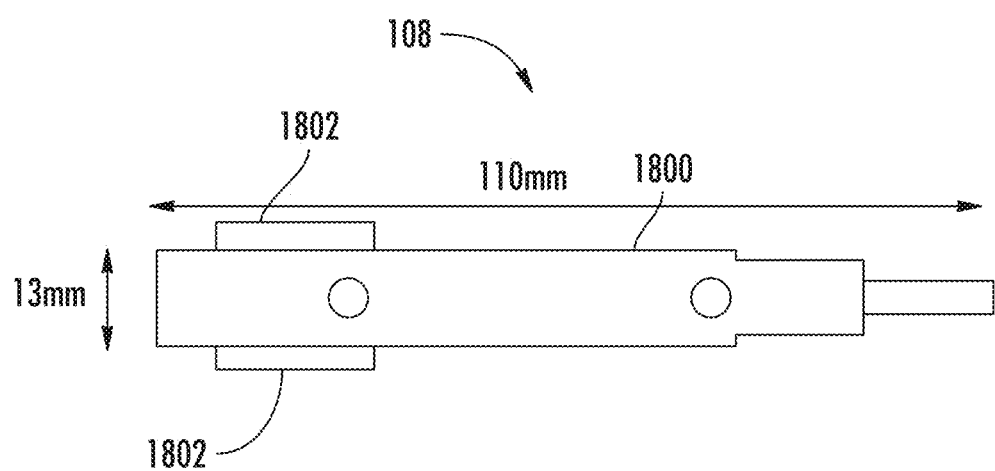
FIG. 18 is a diagram illustrating an alternate resonant actuator design according to an embodiment of the subject matter described herein.
Figure 19:
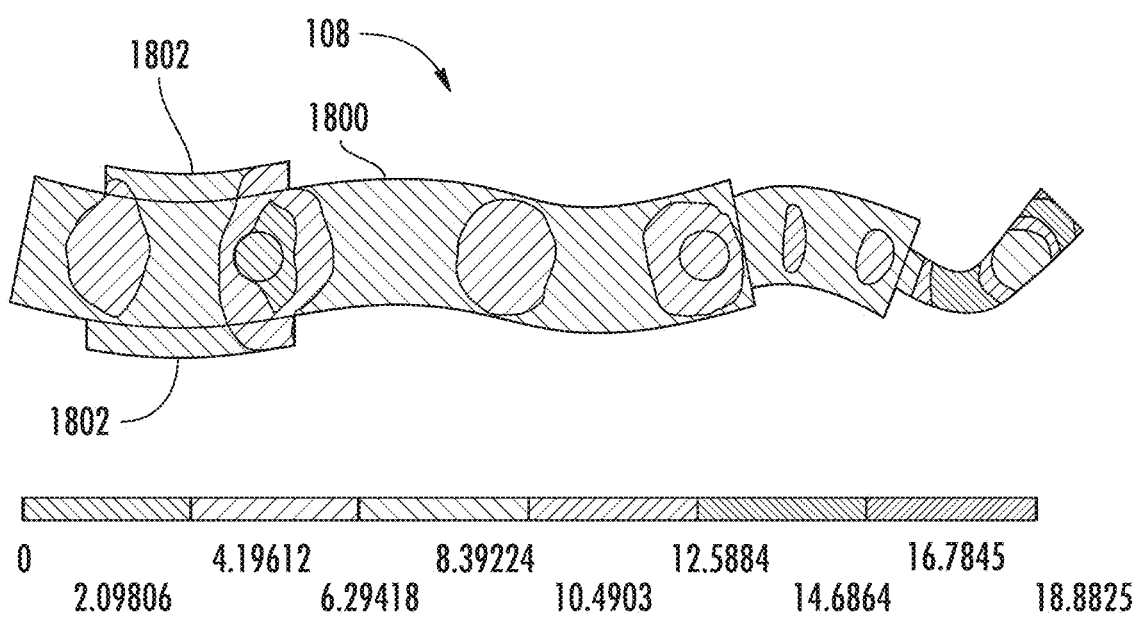
FIG. 19 is a diagram illustrating a simulation of deflection of displacement of the resonant actuator design illustrated in FIG. 18.

FIG. 18 illustrates an alternate geometry for actuator 108 where the beam 1400 is designed to operate at about 50 kilohertz in both the bending and longitudinal directions and meet displacement goals of 3 micrometer amplitude in bending. Table 1 shown below illustrates modeled and measured frequencies using beam 1800 illustrated in FIG. 18.

TABLE 1

Measured and Modeled Actuator Resonant Frequencies

| Direction | Resonant Frequencies | |
|---|---|---|
| | Measured | Modeled |
| Longitudinal | 49,170 Hz | 49,644 Hz |
| Bending | 45,340 Hz | 49,788 Hz |

From Table 1, it can be seen that the actuator achieved a resonant frequency of about 45 kHz in the bending direction and about 50 kHz in the longitudinal direction.

In FIG. 18, actuator 108 includes a beam 1800 with a stepped profile and piezo elements 1802 mounted on opposing sides of the beam. When beam 1800 is excited, the beam bends in two directions as illustrated by the simulation in FIG. 19.

REFERENCES

The disclosure of each of the following references is hereby incorporated herein by reference in its entirety.

[1] Watson G S and Watson J A 2004 Natural nano-structures on insects—possible functions of ordered arrays characterized by atomic force microscopy Appl. Surf. Sci. 235 139-44

[2] Stavenga D G, Foletti S, Palasantzas G and Arikawa K 2006 Light on the moth-eye corneal nipple array of butterflies Proc. R. Soc. Biol. Sci. B 273 661-7

[3] Clapham P B and Hutley M C 1973 Reduction of lens reflexion by the 'moth eye' principle Nature 244 281-2

[4] Kanamori Y, Sasaki M and Hane K 1999 Broadband antireflection gratings fabricated upon silicon substrates Opt. Lett. 24 1422-4

[5] Lalanne P and Morris G M 1997 Antireflection behavior of silicon subwavelength periodic structures for visible light Nanotechnology 8 53-6

[6] Huang Y et al 2007 Improved broadband and quasi-omnidirectional anti-reflection properties with biomimetic silicon nanostructures Nature Nanotechnol. 2 770-4

[7] Grann E, Varga M and Pommet D 1995 Optimal design for antireflective tapered two-dimensional subwavelength Grating structures J. Opt. Soc. Am. A 12 333-9

[8] Wilson S J and Hutley M C 1982 The optical properties of 'moth eye' antireflection surfaces Opt. Acta 29 993-1009

[9] Forberich K, Dennler G, Scharber M C, Hingerl K, Fromherz T and Brabec C J 2008 Performance improvement of organic solar cells with moth eye anti-reflection coating Thin Solid Films 516 7167-70

[10] Boden S A and Bagnall D M 2010 Optimization of moth-eye antireflection schemes for silicon solar cells Prog. Photovolt., Res. Appl. 18 195-203

[11] Toyota H, Takahara K, Okano M, Yotsuya T and Kikuta H 2001 Fabrication of microcone array for antireflection structured surface using metal dotted pattern Japan. J. Appl. Phys. 40 L747-9

[12] Han K, Shin J, Yoon W and Lee H 2011 Enhanced performance of solar cells with anti-reflection layer fabricated by nano-imprint lithography Sol. Energy Mater. Sol. Cells 95 288-91

[13] Tommila J et al 2012 Moth-eye antireflection coating fabricated by nanoimprint lithography on 1 eV dilute nitride solar cell Prog. Photovolt., Res. Appl. at press

[14] Jeong S et al 2012 Hybrid silicon nanocone-polymer solar cells Nano Lett. 12 2971-6

[15] Feng X J and Jiang L 2006 Design and creation of superwetting/antiwetting surfaces Adv. Mater. 18 3063-78

[16] Zhang L, Zhou Z, Cheng B, DeSimone J and Samulski E 2006 Superhydrophobic behavior of a perfluoropolyether lotus-leaf-like topography Langmuir 22 8576

[17] Ahn S et al 2005 Fabrication of a 50 nm half-pitch wire grid polarizer using nanoimprint lithography Nanotechnology 16 1874

[18] Park K, Choi H J, Chang C, Cohen R E, McKinley G H and Barbastathis G 2012 Nanotextured silica surfaces with robust superhydrophobicity and omnidirectional broadband supertransmissivity ACS Nano 6 3789-99

[19] Pharr G M 1998 Measurement of mechanical properties by ultra-low load indentation Mater. Sci. Eng. A 253 151-9

[20] Boden S A and Bagnall D M 2008 Tunable reflection minima of nanostructured antireflective surfaces Appl. Phys. Lett. 93 133108

It will be understood that various details of the presently disclosed subject matter may be changed without departing from the scope of the presently disclosed subject matter. Furthermore, the foregoing description is for the purpose of illustration only, and not for the purpose of limitation.

What is claimed is:

1. A system for producing nanometer scale features in a workpiece, the system comprising:
   a die having a surface with at least one nanometer scale feature located thereon;
   a first actuator for moving the die with respect to the workpiece such that the at least one nanometer scale feature impacts the workpiece and imprints a corresponding at least one nanometer scale feature in the workpiece;
   a second actuator for moving the workpiece, wherein the first actuator reciprocatingly moves the die to repeatedly imprint nanometer scale features at different locations in the workpiece, the first actuator is configured to move the die in an elliptical path while the second actuator is moving the workpiece in a direction parallel to the surface of the die to reduce smearing of the at least one nanometer scale feature imprinted in the workpiece.

2. The system of claim 1 wherein the first actuator operates at a frequency of about 1 kHz to form about 1000 imprints per second in the workpiece.

3. The system of claim 2 wherein the die includes at least about 1600 nanometer scale features such that the about 1000 imprints per second forms at least about 1.6 million nanometer scale features per second in the workpiece.

4. The system of claim 1 wherein the workpiece comprises a substantially flat surface.

5. The system of claim 4 wherein the first actuator comprises a piezoelectric material and a beam, wherein the piezoelectric material is excited to move the beam such that the beam moves at a frequency that is below a resonant frequency of the beam.

6. The system of claim 1 wherein the workpiece comprises a sidewall of a substantially cylindrical surface.

7. The system of claim 1 wherein the first actuator comprises a piezoelectric material and a beam, wherein the piezoelectric material is excited to move the beam at a resonant frequency of the beam in two directions.

8. The system of claim 7 wherein the actuator is configured to have at a resonant frequency of about 45 kilohertz in a bending direction and about 50 kilohertz in a longitudinal direction.

9. The system of claim 1 wherein the workpiece comprises a mold.

10. The system of claim 9 wherein the mold is configured to form an antireflective material.

11. The system of claim 10 wherein the antireflective material comprises a cover for a photovoltaic array.

12. The system of claim 1 wherein the at least one nanometer scale feature has a dimension that is less than a wavelength of visible light.

13. The system of claim 1 at least one nanometer scale feature includes a dimension that is within a range of about 400 nm to about 600 nm.

* * * * *